(12) United States Patent
Torii et al.

(10) Patent No.: US 7,145,285 B2
(45) Date of Patent: Dec. 5, 2006

(54) PIEZOELECTRIC ELEMENT, FABRICATION METHOD FOR THE SAME, AND INKJET HEAD, INKJET RECORDING APPARATUS AND ANGULAR VELOCITY SENSOR INCLUDING THE SAME

(75) Inventors: Hideo Torii, Osaka (JP); Eiji Fujii, Osaka (JP); Takeshi Kamada, Nara (JP); Satoru Fujii, Osaka (JP)

(73) Assignee: Matushita Electric Industrial Co., Ltd., Osaka (JP)

( * ) Notice: Subject to any disclaimer, the term of this patent is extended or adjusted under 35 U.S.C. 154(b) by 203 days.

(21) Appl. No.: 10/894,474

(22) Filed: Jul. 19, 2004

(65) Prior Publication Data

US 2005/0127795 A1    Jun. 16, 2005

(30) Foreign Application Priority Data

Dec. 16, 2003  (JP)  ............................. 2003-418321
Apr. 22, 2004  (JP)  ............................. 2004-127087

(51) Int. Cl.
*H01L 41/08* (2006.01)
(52) U.S. Cl. ................. 310/358; 310/330; 310/331; 310/363; 310/364
(58) Field of Classification Search .......... 31/357–359, 31/324, 328, 311; 252/62.9
See application file for complete search history.

(56) References Cited

U.S. PATENT DOCUMENTS 5,176,033 A * 1/1993 Jones et al. .................... 73/597
6,093,338 A * 7/2000 Tani et al. ............. 252/62.9 R
6,411,017 B1 * 6/2002 Qiu et al. .................... 310/358
6,610,361 B1 * 8/2003 Heuer et al. ........... 427/255.18

FOREIGN PATENT DOCUMENTS

| JP | 2000-208828 A | 7/2000 |
|---|---|---|
| JP | 3481235 | 10/2003 |
| JP | 2004-047928 | 2/2004 |

OTHER PUBLICATIONS

Takayama et al. "Preparation of epitaxial Pb $(Sr_xTi_{1-x})$ $O_3$ thin films and their crystallographic, pyroelectric, and ferroelectric properties"; J. Appl. Phys. 65(4); pp. 1666-1670; Feb. 15, 1989.

* cited by examiner

Primary Examiner—Mark Budd
(74) Attorney, Agent, or Firm—Harness, Dickey & Pierce, P.L.C.

(57) ABSTRACT

A piezoelectric element includes a first electrode; a piezoelectric layered film composed of a first piezoelectric film formed on the first electrode film and a second piezoelectric film that is formed on the first piezoelectric film and is controlled in crystal orientation thereof by the first piezoelectric film; and a second electrode film formed on the second piezoelectric film. Each of the first and second piezoelectric films is an aggregate of columnar grains grown unidirectionally along a thickness direction of the piezoelectric layered film. A columnar grain of the second piezoelectric film has a larger cross-sectional diameter than a columnar grain of the first piezoelectric film. A ratio l/d of the thickness l of the piezoelectric layered film to the cross-sectional diameter d of the second piezoelectric film is not less than 20 and not more than 60.

27 Claims, 17 Drawing Sheets

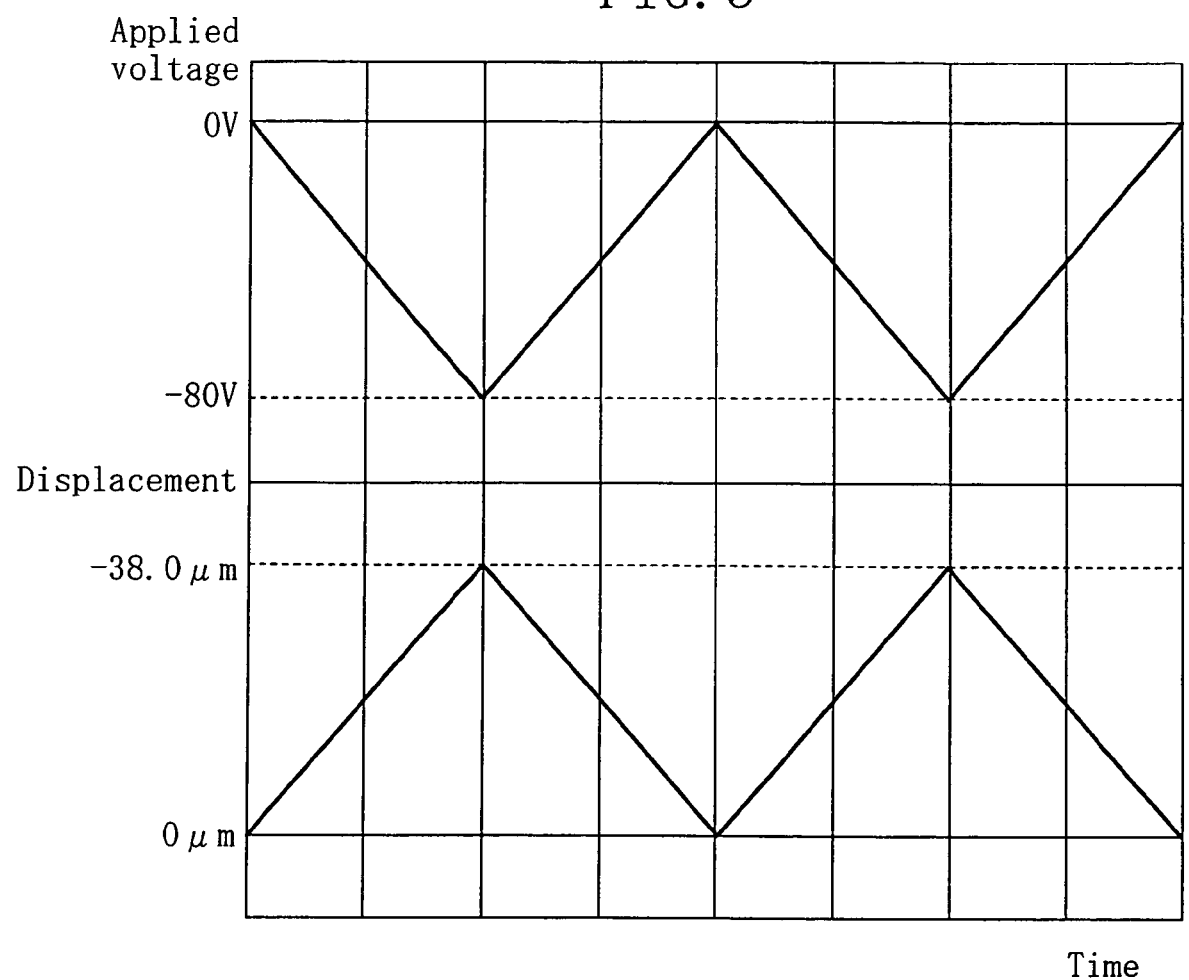

PIEZOELECTRIC ELEMENT, FABRICATION METHOD FOR THE SAME, AND INKJET HEAD, INKJET RECORDING APPARATUS AND ANGULAR VELOCITY SENSOR INCLUDING THE SAME

BACKGROUND OF THE INVENTION

The present invention relates to a piezoelectric element, a fabrication method for the piezoelectric element, and an inkjet head, an inkjet recording apparatus and an angular velocity sensor including the piezoelectric element.

A piezoelectric material converts mechanical energy into electric energy or electric energy into mechanical energy. A typical example of the piezoelectric material is lead zirconate titanate ($Pb(Zr,Ti)O_3$) (hereinafter referred to as "PZT"), that is, an oxide with a perovskite type crystal structure. In using the PZT with a tetragonal crystal structure in particular, the maximum piezoelectric displacement can be obtained along the <001> axis direction (i.e., the c-axis direction). However, most of the piezoelectric materials are polycrystals of aggregates of grains, and the crystal axes of the respective grains extend in various directions. Accordingly, the directions of the spontaneous polarizations Ps are various.

In accordance with recent downsizing of electronic equipment, there is a strong demand also for the downsizing of a piezoelectric element. In order to meet the demand, a piezoelectric element in the form of a thin film, which has a remarkably smaller volume than a conventionally frequently used sintered body, has become more occasionally used. Therefore, various developments and studies have been earnestly made for thinning the piezoelectric element.

For example, since the spontaneous polarization Ps of the PZT extends along the <001> axis direction, in order to realize high piezoelectric properties (piezoelectric displacement properties) even when the piezoelectric element is thinned, it is necessary to make the <001> axis of the crystal included in a PZT thin film extend vertical to one face corresponding to one end thereof along the thickness direction of a substrate. For this purpose, in conventional technique, on a monocrystal substrate of magnesium oxide (MgO) with a rock-salt crystal structure having the (100) plane on a top face thereof, a PZT thin film with good crystallinity and with the <001> axis oriented vertically to one face corresponding to one end thereof along the thickness direction of the substrate is directly formed at a temperature of 600 through 700° C. by sputtering using PZT as a target (for example, see Journal of Applied Physics, U.S.A., the American Institute of Physics, Feb. 15, 1989, Vol. 65, No. 4, pp. 1666–1670). This method is characterized by using the substrate of MgO monocrystal, and owing to this substrate, a piezoelectric thin film with high piezoelectric properties and preferred orientation along the crystal direction can be realized.

The MgO monocrystal is, however, a very expensive material, and therefore, this method is not preferred from the viewpoint of cost when it is applied to mass production of industrial products of piezoelectric elements using the piezoelectric thin film.

Therefore, a method for forming a crystal orientation film of a piezoelectric material on an inexpensive substrate is, for example, a sol-gel method, that is, a typical example of a post annealing method. Now, procedures for forming a crystal orientation film by the sol-gel method performed by using, for example, a $SrTiO_3$ substrate will be described. First, on a $RuO_2$ under electrode formed by the sputtering on the substrate, a sol solution including Zr and Ti in a concentration ratio of 75:25 is applied by spin coating, and the resultant is annealed and dried, so as to form a precursor film. Next, on this precursor film, several layers of a precursor film are formed by using a sol solution including Zr and Ti in a concentration ratio of 52:48, and thereafter, the resultant is burned at a high temperature of 900° C. In this manner, a PZT-based piezoelectric oxide thin film with the (001) crystal orientation is synthesized without causing a crack (see, for example, Japanese Laid-Open Patent Publication No. 2000-208828 (pp. 3–4)).

When the PZT thin film having the crystal orientation along the (001) plane corresponding to the crystal direction with a large piezoelectric constant is formed in the aforementioned manner, a piezoelectric thin film with high piezoelectric properties can be formed.

On the other hand, as a method for forming a crystal orientation film on an inexpensive substrate, the present inventors have developed a method for synthesizing the crystal orientation film without performing post annealing but employing, for example, sputtering. Now, procedures for forming a crystal orientation film by this method will be described. First, an electrode thin film made of a noble metal alloy of platinum (Pt) or iridium (Ir) including titanium (Ti) is deposited on a substrate as an underlying electrode by the sputtering. Next, a thin film of an oxide not including Zr and having the (001) crystal orientation, such as lead lanthanum titanate (PLT), that is, an oxide with the perovskite type crystal structure, is formed on the electrode thin film as an initial layer by the sputtering. Thereafter, a PZT film is deposited on the initial layer by the sputtering. Thus, a PZT thin film with the (001) crystal orientation can be obtained.

Furthermore, the present inventors have found that when an electrode thin film of a noble metal alloy including cobalt (Co), nickel (Ni), manganese (Mn), iron (Fe) or copper (Cu) is used as the underlying electrode and a PZT film is directly formed on the electrode thin film, a PZT thin film with the (001) crystal orientation can be obtained.

Also when the PZT thin film with the crystal orientation along the (001) plane corresponding to the crystal direction with a large piezoelectric constant is formed in the aforementioned manner, a piezoelectric thin film with high piezoelectric properties can be formed.

Since the piezoelectric thin film formed in the aforementioned manner exhibits a large piezoelectric constant, large piezoelectric displacement can be caused even when the applied voltage is low, and therefore, such a piezoelectric thin film is expected to be used as an actuator in a variety of fields. Also, when a high voltage is applied to the piezoelectric thin film, further larger piezoelectric displacement can be caused.

When a high voltage is applied to an actuator in which a PZT film is formed by the sputtering not requiring the post annealing in the aforementioned manner, however, film peeling is disadvantageously caused between a film used as the underlying electrode and the perovskite type oxide film. Therefore, such an actuator has insufficient durability as a piezoelectric actuator for causing large displacement.

SUMMARY OF THE INVENTION

The present invention was devised in consideration of the aforementioned conventional disadvantages, and an object of the invention is providing a piezoelectric element with high reliability capable of exhibiting high durability even when driven at a high voltage for obtaining large actuator displacement.

In order to overcome the disadvantages, the piezoelectric element of this invention includes a first electrode film; a piezoelectric layered film composed of a first piezoelectric film formed on the first electrode film and a second piezoelectric film that is formed on the first piezoelectric film and is controlled in crystal orientation thereof by the first piezoelectric film; and a second electrode film formed on the second piezoelectric film, and each of the first piezoelectric film and the second piezoelectric film is an aggregate of columnar grains grown unidirectionally along a thickness direction of the piezoelectric layered film, a columnar grain of the second piezoelectric film has a larger cross-sectional diameter than a columnar grain of the first piezoelectric film, and a ratio l/d of a thickness l of the piezoelectric layered film to the cross-sectional diameter d of the columnar grain of the second piezoelectric film is not less than 20 and not more than 60.

Preferably, in the piezoelectric element of this invention, each of the first piezoelectric film and the second piezoelectric film includes at least Pb, Zr and Ti in a chemical composition ratio of Pb:Zr:Ti of (1+a):b:(1−b), the b has a value that is the same and is not less than 0.50 and not more than 0.60 in the first and second piezoelectric films, a Pb content in the first piezoelectric film is larger than a Pb content in the second piezoelectric film, and the a has a value that is not less than 0.05 and not more than 0.15 in the first piezoelectric film and a value that is not less than 0 and not more than 0.10 in the second piezoelectric film.

Thus, adhesion between the first electrode film and the first piezoelectric film is improved. Therefore, even when a high voltage is applied, film peeling is never caused between the first electrode film and the first piezoelectric film. Accordingly, a piezoelectric element having high piezoelectric properties and free from degradation can be realized.

Alternatively, the piezoelectric element of this invention includes a first electrode film; a buffer layer film formed on the first electrode film; a piezoelectric layered film composed of a first piezoelectric film formed on the buffer layer film and a second piezoelectric film that is formed on the first piezoelectric film and is controlled in crystal orientation thereof by the first piezoelectric film; and a second electrode film formed on the second piezoelectric film, and each of the first piezoelectric film and the second piezoelectric film is an aggregate of columnar grains grown unidirectionally along a thickness direction of the piezoelectric layered film, a columnar grain of the second piezoelectric film has a larger cross-sectional diameter than a columnar grain of the first piezoelectric film, and a ratio l/d of a thickness l of the piezoelectric layered film to the cross-sectional diameter d of the columnar grain of the second piezoelectric film is not less than 20 and not more than 60.

Preferably, in the piezoelectric element of this invention, each of the first piezoelectric film and the second piezoelectric film includes at least Pb, Zr and Ti in a chemical composition ratio of Pb:Zr:Ti of (1+a):b:(1−b), and the b has a value that is the same and is not less than 0.50 and not more than 0.60 in the first and second piezoelectric films.

Thus, adhesion between the first electrode film and the first piezoelectric film is improved. Therefore, even when a high voltage is applied, film peeling is never caused between the first electrode film and the first piezoelectric film. Accordingly, a piezoelectric element having high piezoelectric properties and free from degradation can be realized. Furthermore, when the buffer layer film is thus used, a first piezoelectric film with high adhesion with the first electrode film can be easily formed on the buffer layer film.

In the piezoelectric element of this invention, the buffer layer film is preferably made of lead lanthanum titanate or lead lanthanum titanate including at least one of magnesium (Mg) and manganese (Mn).

Alternatively, in the piezoelectric element of this invention, the buffer layer film is preferably made of an oxide with a perovskite type crystal structure including strontium (Sr).

Alternatively, in the piezoelectric element of this invention, the buffer layer film preferably includes strontium titanate.

Moreover, the piezoelectric element of this invention preferably further includes a diaphragm film formed on a face of the first electrode film opposite to the first piezoelectric film or on a face of the second electrode film opposite to the second piezoelectric film. The diaphragm film is preferably made of one of silicon, glass, a ceramic material and a metal material.

In the piezoelectric element of this invention, the columnar grain of the first piezoelectric film preferably has a cross-sectional diameter not less than 40 nm and not more than 70 nm and a length not less than 5 nm and not more than 100 nm.

In the piezoelectric element of this invention, the columnar grain of the second piezoelectric film preferably has a cross-sectional diameter not less than 60 nm and not more than 200 nm and a length not less than 2500 nm and not more than 5000 nm.

Preferably, in the piezoelectric element of this invention, each of the first piezoelectric film and the second piezoelectric film is made of an oxide with a perovskite type crystal structure including at least Pb, Zr and Ti, and assuming that a (001) crystal orientation ratio of a piezoelectric film obtained on the basis of refraction intensities of respective crystal faces of a diffraction pattern obtained by X-ray diffraction method is defined as a percentage of a sum of a (001) peak intensity and a (002) peak intensity to a sum of all peak intensities derived from the piezoelectric film within an X-ray diffraction range of an interstitial distance of 4.2 Å to 1.5 Å, the first piezoelectric film has a (001) crystal orientation ratio not less than 50% and not more than 80% and the second piezoelectric film has a (001) crystal orientation ratio not less than 95% and not more than 100%.

Preferably, in the piezoelectric element of this invention, the first electrode film is made of a noble metal of Pt or Ir, or an alloy of the noble metal including at least one of Ti, Co and Ni, and is an aggregate of columnar grains each with a cross-sectional diameter not less than 20 nm and not more than 30 nm.

Thus, the first electrode film can activate the function of the first piezoelectric film as a crystal orientation controlling film. Therefore, the first piezoelectric film can definitely control the crystal orientation of the second piezoelectric film.

The method for fabricating a piezoelectric element of this invention includes the steps of depositing a first electrode film on a substrate by sputtering; depositing a first piezoelectric film on the first electrode film by sputtering performed by using a given material as a target under given deposition conditions; forming a piezoelectric layered film by depositing a second piezoelectric film on the first piezoelectric film by sputtering performed by using the given material as a target under deposition conditions different from the given deposition conditions; and depositing a second electrode film on the second piezoelectric film by sputtering.

Alternatively, the method for fabricating a piezoelectric element of this invention includes the steps of depositing a first electrode film on a substrate by sputtering; depositing a buffer layer film on the first electrode film by sputtering performed by using a first material as a target under first deposition conditions; depositing a first piezoelectric film on the buffer layer film by sputtering performed by using a second material as a target under second deposition conditions; forming a piezoelectric layered film by depositing a second piezoelectric film on the first piezoelectric film by sputtering performed by using the second material as a target under deposition conditions different from the second deposition conditions; and depositing a second electrode film on the second piezoelectric film by sputtering.

Preferably, the method for fabricating a piezoelectric element of this invention further includes the steps of depositing a diaphragm film on the second electrode film by sputtering; and removing the substrate.

The inkjet head of this invention includes a head body including a nozzle and a pressure chamber, for containing an ink, communicated with the nozzle; and a piezoelectric element, which is provided with a part of a face corresponding to one end thereof along a thickness direction facing the pressure chamber, for applying a pressure to the ink contained in the pressure chamber for discharging the ink from the nozzle, and the piezoelectric element includes a first electrode film, a piezoelectric layered film composed of a first piezoelectric film formed on the first electrode film and a second piezoelectric film formed on the first piezoelectric film and controlled in crystal orientation thereof by the first piezoelectric film, and a second electrode film formed on the second piezoelectric film, each of the first piezoelectric film and the second piezoelectric film is an aggregate of columnar grains grown unidirectionally along a thickness direction of the piezoelectric layered film, a columnar grain of the second piezoelectric film has a cross-sectional diameter larger than a columnar grain of the first piezoelectric film, and a ratio l/d of a thickness l of the piezoelectric layered film to the cross-sectional diameter d of the columnar grain of the second piezoelectric film is not less than 20 and not more than 60.

Alternatively, the inkjet head of this invention includes a head body including a nozzle and a pressure chamber, for containing an ink, communicated with the nozzle; and a piezoelectric element, which is provided with a part of a face corresponding to one end thereof along a thickness direction facing the pressure chamber, for applying a pressure to the ink contained in the pressure chamber for discharging the ink from the nozzle, and the piezoelectric element includes a first electrode film, a buffer layer film formed on the first electrode film, a piezoelectric layered film composed of a first piezoelectric film formed on the buffer layer film and a second piezoelectric film formed on the first piezoelectric film and controlled in crystal orientation thereof by the first piezoelectric film, and a second electrode film formed on the second piezoelectric film, each of the first piezoelectric film and the second piezoelectric film is an aggregate of columnar grains grown unidirectionally along a thickness direction of the piezoelectric layered film, a columnar grain of the second piezoelectric film has a cross-sectional diameter larger than a columnar grain of the first piezoelectric film, and a ratio l/d of a thickness l of the piezoelectric layered film to the cross-sectional diameter d of the columnar grain of the second piezoelectric film is not less than 20 and not more than 60.

The inkjet recording apparatus of this invention includes an inkjet head including a head body having a nozzle and a pressure chamber, for containing an ink, communicated with the nozzle, and a piezoelectric element, which is provided with a part of a face corresponding to one end thereof along a thickness direction facing the pressure chamber, for applying a pressure to the ink contained in the pressure chamber for discharging the ink from the nozzle; and a moving section for moving the inkjet head relatively to a recording medium, and the piezoelectric element includes a first electrode film, a piezoelectric layered film composed of a first piezoelectric film formed on the first electrode film and a second piezoelectric film formed on the first piezoelectric film and controlled in crystal orientation thereof by the first piezoelectric film, and a second electrode film formed on the second piezoelectric film, each of the first piezoelectric film and the second piezoelectric film is an aggregate of columnar grains grown unidirectionally along a thickness direction of the piezoelectric layered film, a columnar grain of the second piezoelectric film has a cross-sectional diameter larger than a columnar grain of the first piezoelectric film, and a ratio l/d of a thickness l of the piezoelectric layered film to the cross-sectional diameter d of the columnar grain of the second piezoelectric film is not less than 20 and not more than 60.

Alternatively, the inkjet recording apparatus of this invention includes an ink-jet head including a head body having a nozzle and a pressure chamber, for containing an ink, communicated with the nozzle, and a piezoelectric element, which is provided with a part of a face corresponding to one end thereof along a thickness direction facing the pressure chamber, for applying a pressure to the ink contained in the pressure chamber for discharging the ink from the nozzle; and a moving section for moving the inkjet head relatively to a recording medium, and the piezoelectric element includes a first electrode film, a buffer layer film formed on the first electrode film, a piezoelectric layered film composed of a first piezoelectric film formed on the buffer layer film and a second piezoelectrc film formed on the first piezoelectric film and controlled in crystal orientation thereof by the first piezoelectric film, and a second electrode film formed on the second piezoelectric film, each of the first piezoelectric film and the second piezoelectric film is an aggregate of columnar grains grown unidirectionally along a thickness direction of the piezoelectric layered film, a columnar grain of the second piezoelectric film has a cross-sectional diameter larger than a columnar grain of the first piezoelectric film, and a ratio l/d of a thickness l of the piezoelectric layered film to the cross-sectional diameter d of the columnar grain of the second piezoelectric film is not less than 20 and not more than 60.

The angular velocity sensor of this invention includes a substrate composed of a fixed part and at least a pair of vibrating parts extending from the fixed part toward a given direction; and a piezoelectric element provided on at least each of the vibrating parts on the substrate, and the piezoelectric element includes a first electrode film, a piezoelectric layered film composed of a first piezoelectric film formed on the first electrode film and a second piezoelectric film formed on the first piezoelectric film and controlled in crystal orientation thereof by the first piezoelectric film, and a second electrode film formed on the second piezoelectric film, each of the first piezoelectric film and the second piezoelectric film is an aggregate of columnar grains grown unidirectionally along a thickness direction of the piezoelectric layered film, a columnar grain of the second piezoelectric film has a cross-sectional diameter larger than a columnar grain of the first piezoelectric film, a ratio l/d of a thickness l of the piezoelectric layered film to the cross-sectional diameter d of the columnar grain of the second piezoelectric film is not less than 20 and not more than 60, and the second electrode film is formed in patterns of at least one driving electrode for vibrating the vibrating parts along a width direction of the vibrating parts and at least one detecting electrode for detecting deformation along the thickness direction of the vibrating parts.

Alternatively, the angular velocity sensor of this invention includes a substrate composed of a fixed part and at least a pair of vibrating parts extending from the fixed part toward a given direction; and a piezoelectric element provided on at least each of the vibrating parts on the substrate, and the piezoelectric element includes a first electrode film, a buffer layer film formed on the first electrode film, a piezoelectric layered film composed of a first piezoelectric film formed on the buffer layer film and a second piezoelectric film formed on the first piezoelectric film and controlled in crystal orientation thereof by the first piezoelectric film, and a second electrode film formed on the second piezoelectric film, each of the first piezoelectric film and the second piezoelectric film is an aggregate of columnar grains grown unidirectionally along a thickness direction of the piezoelectric layered film, a columnar grain of the second piezoelectric film has a cross-sectional diameter larger than a columnar grain of the first piezoelectric film, a ratio l/d of a thickness l of the piezoelectric layered film to the cross-sectional diameter d of the columnar grain of the second piezoelectric film is not less than 20 and not more than 60, and the second electrode film is formed in patterns of at least one driving electrode for vibrating the vibrating parts along a width direction of the vibrating parts and at least one detecting electrode for detecting deformation along the thickness direction of the vibrating parts.

In the angular velocity sensor of this invention, the substrate is preferably made of silicon or glass.

The piezoelectric element of this invention is applicable not only to an inkjet head, an inkjet recording apparatus and an angular velocity sensor but also to electronic components such as a gyrostabilizer and a mechanical vibration sensor.

According to this invention, since the adhesion between the first electrode film and the first piezoelectric film is high, a piezoelectric element having high piezoelectric properties and high durability can be realized. Also, according to the method for fabricating a piezoelectric element of this invention, piezoelectric elements having high piezoelectric properties and high durability can be easily mass produced. Furthermore, the present invention provides a highly reliable inkjet head with minimized variation in discharging an ink and an inkjet recording apparatus including the inkjet head.

Moreover, the present invention provides highly reliable thin angular velocity sensors that can be easily mass produced.

BRIEF DESCRIPTION OF THE DRAWINGS

FIG. 5 is a diagram for showing displacement in vertical movement along the Z-axis direction of a tip of the piezoelectric element obtained under application of a voltage with a frequency of 2 kHz;

DETAILED DESCRIPTION OF THE INVENTION

Preferred embodiments of the invention will now be described with reference to the accompanying drawings.

Embodiment 1

Figure 1:
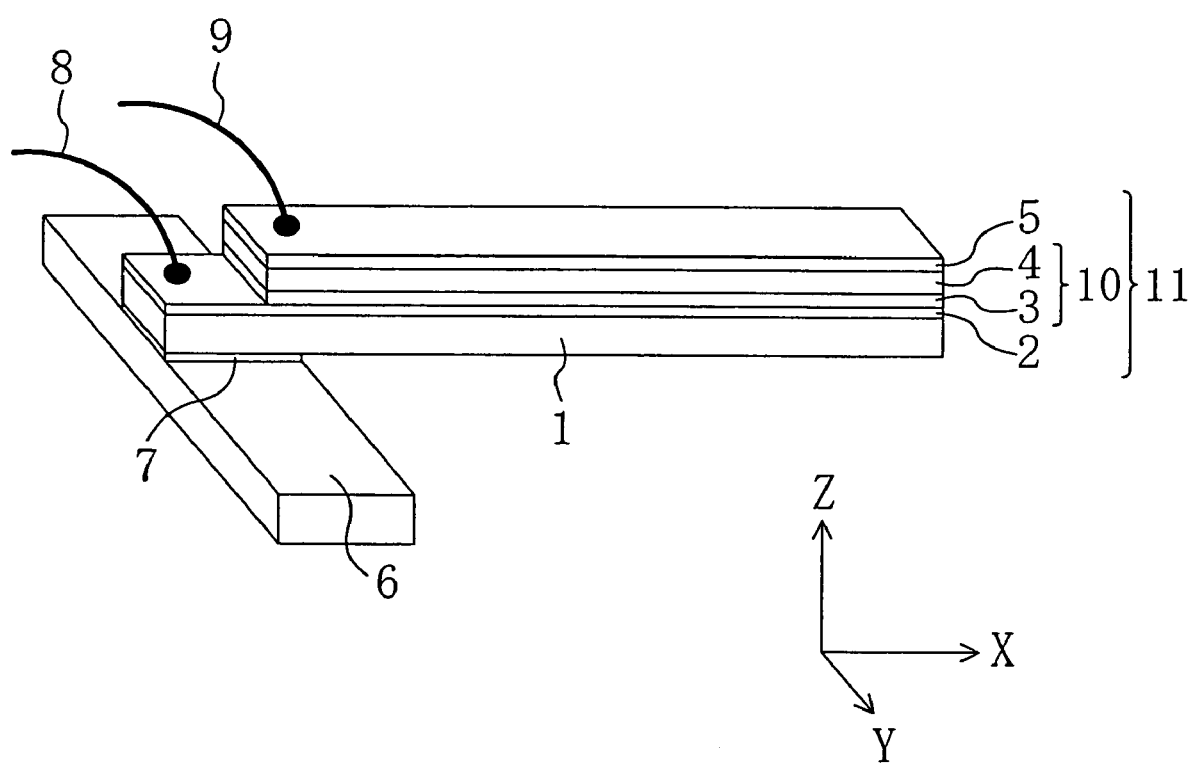
FIG. 1 is a perspective view of a piezoelectric element according to an embodiment of the invention.

A piezoelectric element 20 according to Embodiment 1 of the invention includes, as shown in FIG. 1, a substrate 1 in the shape of a strip (with a thickness of 0.30 mm, a width of 3.0 mm and a length of 15.0 mm) and a layered body 11 formed on the substrate 1. The piezoelectric element 20 has a width of 3.0 mm. One end portion along the longitudinal direction of the piezoelectric element 20 (that is, the left end portion in FIG. 1) is fixed on a stainless steel supporting substrate 6 (with a thickness of 1.0 mm, a width of 3.0 mm and a length of 10.0 mm) with an epoxy resin adhesive 7. The end portion herein means a portion with a length of 3.0 mm from the end of the piezoelectric element 20 (that is, the left end in FIG. 1). The longitudinal direction of the piezoelectric element 20 is substantially perpendicular to the longitudinal direction of the stainless steel supporting substrate 6. Thus, the piezoelectric element 20 is constructed as a cantilever.

The substrate 1 also works as a diaphragm film for inhibiting expansion and contraction of the layered body 11 caused by the piezoelectric effect. The layered body 11 includes a first electrode film 2 formed on the substrate 1, a piezoelectric layered film 10 formed on the first electrode film 2 and a second electrode film 5 formed on the piezoelectric layered film 10.

The first electrode film 2 is formed over one face of the substrate 1. The piezoelectric layered film 10 is formed on the first electrode film 2 excluding a portion above the aforementioned end portion. Specifically, the piezoelectric layered film 10 has a width of 3.0 mm and a length of 12.0 mm. The piezoelectric layered film 10 is made of lead zirconate titanate-based oxide (hereinafter refereed to as the PZT-based oxide) with the perovskite type crystal structure with (001) preferred orientation. The PZT-based oxide is an oxide including at least Pb, Zr and Ti. More specifically, the piezoelectric layered film 10 includes a first piezoelectric film 3 formed on the first electrode film 2 and a second piezoelectric film 4 formed on the first piezoelectric film 3. The first piezoelectric film 3 has a function as a crystal orientation controlling film for controlling the crystal orientation of the second piezoelectric film 4. The second electrode film 5 is made of platinum (Pt) with a thickness of 250 nm. The first and second electrode films 2 and 5 are respectively connected to leads 8 and 9.

Figure 3:
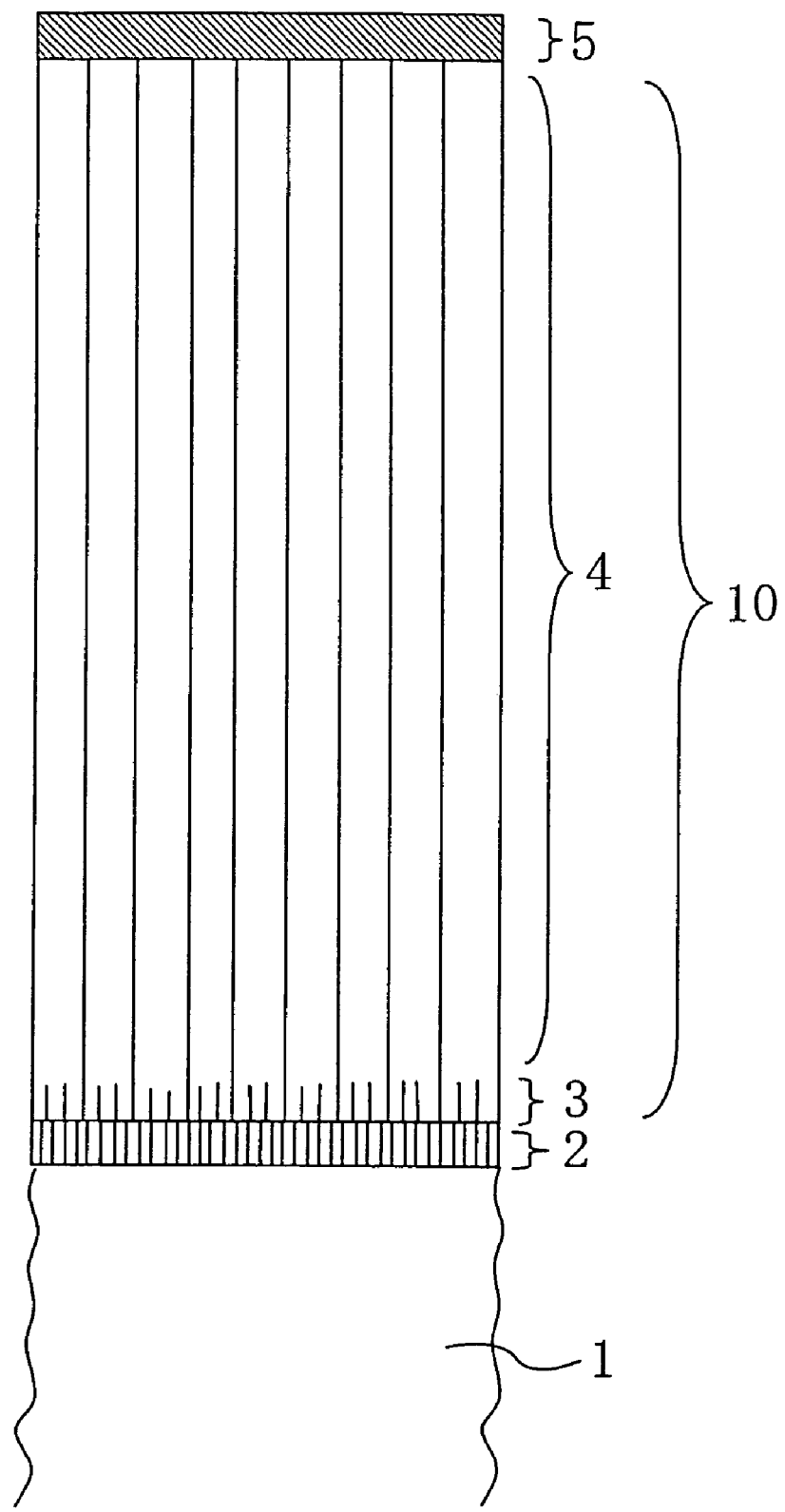
FIG. 3 is a schematic diagram for showing the film structure of the piezoelectric element.

As a characteristic of this invention, each of the first and second piezoelectric films 3 and 4 is an aggregate of columnar grains having a crystal growth direction unidirectionally along the thickness direction of the piezoelectric layered film 10 (the first and second piezoelectric films 3 and 4) (see FIG. 3). In other words, each of the first and second piezoelectric films 3 and 4 is an aggregate of columnar grains grown in a vertical direction to a plane corresponding to one end thereof along the thickness direction of the substrate 1 (the first electrode film 2). The columnar grains of the first and second piezoelectric films 3 and 4 are continuously linked to each other.

Also, the cross-sectional diameter of the columnar grain of the second piezoelectric film 4 is larger than the cross-sectional diameter of the columnar grain of the first piezoelectric film 3. A ratio l/d of the thickness l of the piezoelectric layered film 10 (i.e., the length of the columnar grain of the piezoelectric layered film 10) to the cross-sectional diameter d of the columnar grain of the second piezoelectric film 4 is not less than 20 and not more than 60. When the ratio l/d is smaller than 20, cracks are disadvantageously caused in the piezoelectric layered film 10 due to stress caused in deposition, and when the ratio l/d exceeds 60, the responsibility is disadvantageously lowered because power consumed in driving is large.

The columnar grain of the first piezoelectric film 3 has a cross-sectional diameter not less than 40 nm and not more than 70 nm and a length not less than 5 nm and not more than 100 nm. The columnar grain of the second piezoelectric film 4 has a cross-sectional diameter not less than 60 nm and not more than 200 nm and a length not less than 2500 nm and not more than 5000 nm.

Furthermore, the (001) crystal orientation ratio (which will be described in detail below) of the first piezoelectric film 3 is not less than 50% and not more than 80%. The (001) crystal orientation ratio of the second piezoelectric film 4 is not less than 95% and not more than 100%.

Also, in each of the first and second piezoelectric films 3 and 4, a chemical composition ratio of Pb:Zr:Ti is represented by (1+a):b:(1−b). The value b is not less than 0.50 and not more than 0.60 in the first and second piezoelectric films 3 and 4. The content of Pb in the first piezoelectric film 3 is larger than that in the second piezoelectric film 4. The value a is not less than 0.05 and not more than 0.15 in the first piezoelectric film 3 and is not less than 0 and not more than 0.10 in the second piezoelectric film 4.

Moreover, the first electrode film 2 is made of a noble metal of Pt or Ir, or an alloy of the noble metal including at least one of Ti, Co and Ni, and is an aggregate of columnar grains having the crystal growth direction unidirectionally along the thickness direction of the first electrode film 2 and having a cross-sectional diameter not less than 20 nm and not more than 30 nm.

When a voltage is applied to the first and second electrode films 2 and 5 of the piezoelectric element 20 through the leads 8 and 9, the piezoelectric layered film 10 expands along the X-axis direction. Assuming that a voltage E (V) is applied and the piezoelectric layered film 10 has a thickness t (m), a length L (m) and a piezoelectric constant $d_{31}$ (pico m/V), the expansion amount AL (m) along the X-axis direction of the piezoelectric layered film 10 is obtained by the following expression (1):

$$\Delta L = d_{31} \times L \times E / t \qquad (1)$$

Also, an upper portion of the piezoelectric layered film 10 jointed to the second electrode film 5 expands along the X-axis direction but the expansion of a lower portion of the piezoelectric layered film 10 jointed to the first electrode film 2 is suppressed by the substrate 1 with a large thickness. As a result, the end opposite to the aforementioned one end (i.e., the right end in FIG. 1; hereinafter referred to as the tip) of the piezoelectric element 20 is displaced toward the −Z direction along the Z-axis (i.e., downward in FIG. 1). Accordingly, when the voltage application is repeated at constant periods, the tip of the piezoelectric element 20 is displaced along the Z-axis direction with a given displacement range. When the relationship between the applied voltage and the displacement range of the tip of the piezoelectric element 20 is examined, the displacement property of the piezoelectric element 20 can be evaluated.

Fabrication Method for Piezoelectric Element

Figure 2A:
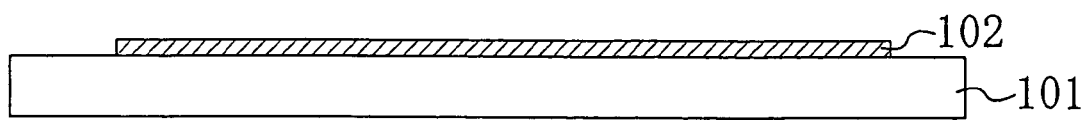
FIGS. 2A, 2B, 2C, 2D and 2E are diagrams for showing procedures for fabricating the piezoelectric element.

Now, the method for fabricating the piezoelectric element 20 will be described with reference to FIGS. 2A through 2E. First, as shown in FIG. 2A, a first electrode film 102 is deposited on a silicon substrate 101 having the (001) plane polished and having a length of 20 mm, a width of 20 mm and a thickness of 0.30 mm by rf-magnetron sputtering described below by using a stainless steel mask (with a thickness of 0.2 mm) having a rectangular opening with a width of 5.0 mm and a length of 18.0 mm.

Next, a piezoelectric layered film 110 is accurately deposited on the first electrode film 102 by the rf-magnetron sputtering by using a stainless steel mask (with a thickness of 0.2 mm) having a rectangular opening with a width of 5.0 mm and a length of 12.0 mm. Specifically, the piezoelectric layered film 110 is deposited as follows: First, a first piezoelectric film 103 is deposited on the first electrode film 102 by the rf-magnetron sputtering performed under given deposition conditions by using a sintered body of a PZT oxide as a target. Then, a second piezoelectric film 104 is continuously deposited on the first piezoelectric film 103 by the rf-magnetron sputtering performed under deposition conditions different from those employed for forming the first piezoelectric film 103 and by using the same target as that used in forming the first piezoelectric film 103.

Figure 2B:
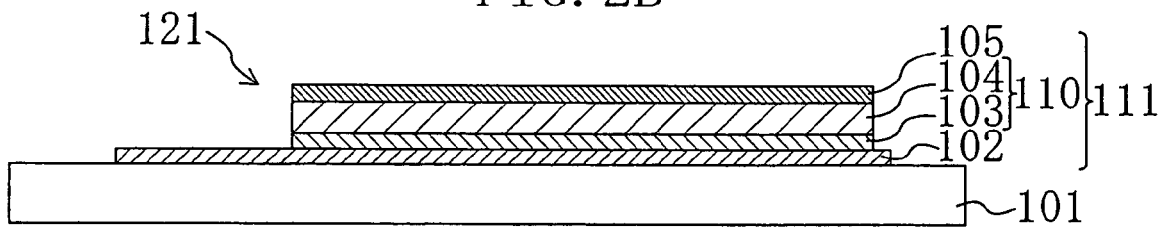

Thereafter, a second electrode film 105 is accurately deposited on the piezoelectric layered film 110 by the rf-magnetron sputtering by using a stainless steel mask in the same shape as that of the above-described mask. In this manner, as shown in FIG. 2B, a structure 121 composed of the substrate 101 and a layered body 111 including the piezoelectric layered film 110 formed on the substrate 101 is obtained.

Figure 2C:
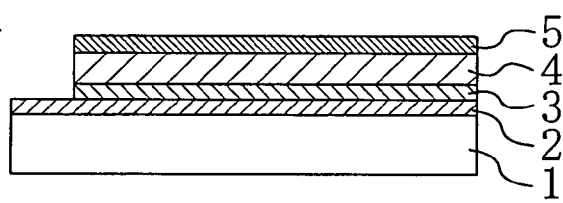

Next, as shown in FIG. 2C, the structure 121 is accurately cut with a dicing saw so that the resultant can be in the shape of a strip with a width of 3.0 mm and a length of 15.0 mm and that a portion with a length of 3.0 mm from one end (i.e., the left end in FIG. 2C) of a first electrode film 2 can be exposed. As a result, a piezoelectric element structure component 22 in which the first electrode film 2, a first piezoelectric film 3, a second piezoelectric film 4 and a second electrode film 5 are stacked on a substrate 1 in this order can be obtained.

Figure 2D:
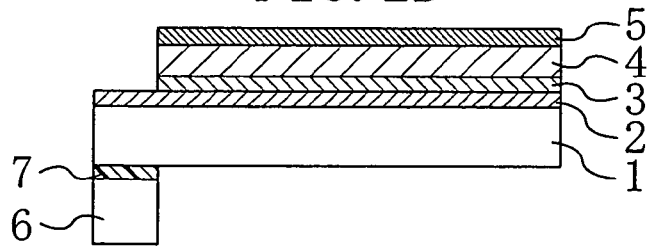

Then, as shown in FIG. 2D, the exposed portion of the first electrode film 2 above the substrate 1 (i.e., the left end portion in FIG. 2D) is jointed on a stainless steel supporting substrate 6 with an epoxy resin adhesive 7.

Figure 2E:
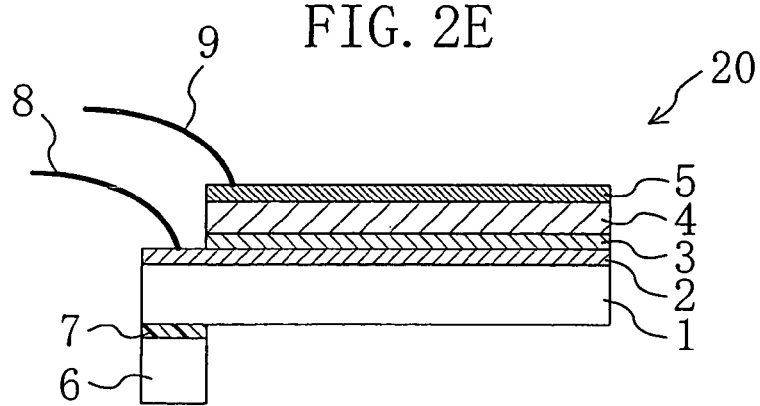

Next, as shown in FIG. 2E, a lead 8 of gold of 0.1 mm is connected to the exposed portion of the first electrode 2 with a conductive adhesive (conductive paste containing silver), and a lead 9 is connected to a portion of the second electrode film 5 close to the exposed portion of the first electrode film 2 by wire bonding. Thus, the piezoelectric element 20 as shown in FIG. 1 is obtained. FIG. 3 is a schematic diagram for showing the film structure of the piezoelectric element 20.

Now, specifically practiced examples will be described.

EXAMPLE 1

In this example, a silicon substrate was used as the substrate 101 and an iridium (Ir) thin film with a thickness of 100 nm was used as the first electrode film 102. This iridium thin film was deposited by using a ternary rf-magnetron sputtering system. Specifically, the silicon substrate 101 was previously annealed to 400° C. and the temperature was kept. A mixed gas of argon and oxygen (with a gas volume ratio of $Ar:O_2$ of 15:1) was used as a sputtering gas and a total gas pressure was kept at 0.25 Pa. Iridium was used as a first target of the ternary magnetron sputtering system. The sputtering was performed for 960 seconds under application of high frequency power of 200 W, thereby depositing the iridium thin film (without using second and third targets).

The thickness of the piezoelectric layered film 110 was set to 3550 nm. The piezoelectric layered film 110 was composed of a first piezoelectric film 103 with a thickness of 50 nm made of lead zirconate titanate (hereinafter referred to PZT) with the (001) preferred orientation and a second piezoelectric film 104 with a thickness of 3500 nm made of PZT with the (001) preferred orientation.

The first and second piezoelectric films 103 and 104 were deposited by using an rf-magnetron sputtering system (as shown in FIG. 2B). At this point, a sintered body with a diameter of 6 inches of PZT with a stoichiometric composition prepared by excessively adding approximately 20 mol % of PbO (having a composition molar ratio of Pb:Zr:Ti of 1.20:0.53:0.47) was used as a target. Also, the first and second piezoelectric films 103 and 104 were deposited under the following conditions: In a deposition chamber provided with the target, the silicon substrate 101 having the first electrode film 102 on one face thereof was previously annealed to 580° C. and the substrate temperature was kept. A mixed gas of argon and oxygen (with a gas volume ratio of $Ar:O_2$ of 38:2) was used as a sputtering gas, and the gas pressure and the flow rate were set to 0.2 Pa and 40 ml/min., respectively. With plasma generating power set to 3 kW, the first piezoelectric film 103 was deposited for 50 seconds. Thereafter, the deposition was once stopped, the mixing ratio (the gas volume ratio) of $Ar:O_2$ of the sputtering gas alone was changed to 79:1 without changing the other deposition conditions, and the second piezoelectric film 104 was deposited for 2900 seconds.

In order to accurately obtain the thickness, the (001) crystal orientation, the composition and the cross-sectional structure of the first piezoelectric film 103 of FIG. 2B, another layered film was also prepared as a sample by ending the deposition after forming the first piezoelectric film 103. This sample was observed on its surface with a scanning electron microscope and analyzed in its composition through X-ray diffraction and X-ray microanalyzer. Thereafter, the sample was broken, and the resultant broken-out section was observed with a scanning electron microscope.

Furthermore, in order to accurately obtain the thickness, the (001) crystal orientation, the composition and the cross-sectional structure of the second piezoelectric film 104 of FIG. 2B, another layered film was also prepared as a sample by ending the deposition after forming the second piezoelectric film 104. Also this sample was similarly observed on its surface with a scanning electron microscope and analyzed in its composition through X-ray diffraction and X-ray microanalyzer, and then was broken so as to observe the resultant broken-out section with a scanning electron microscope.

Figure 4A:
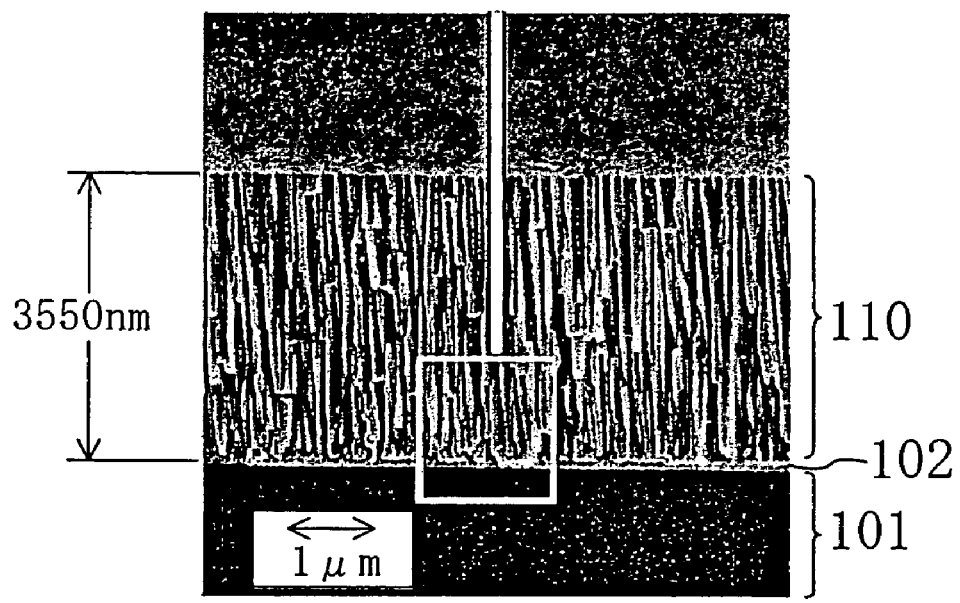
FIGS. 4A and 4B are scanning electron micrographs of enlarged broken-out sections of a piezoelectric layered film.
Figure 4B:
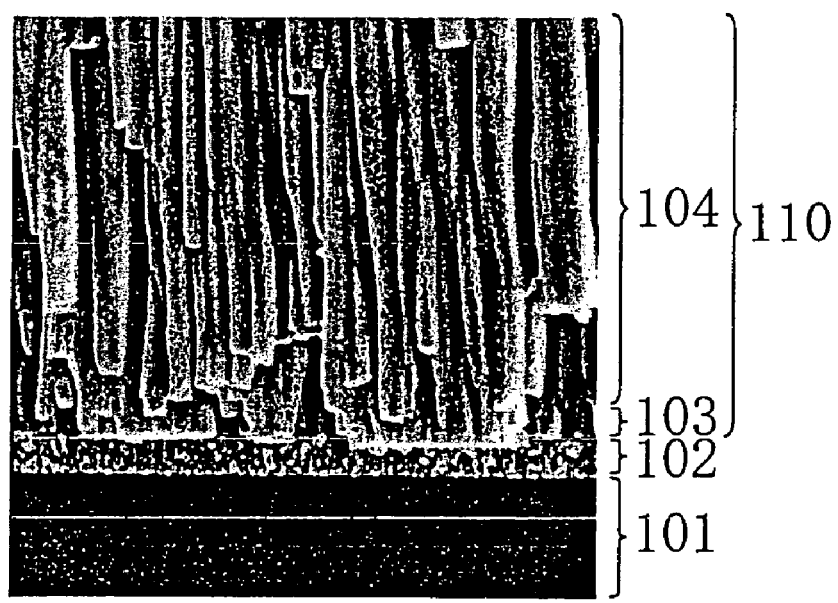

Also, the structure 121 of FIG. 2B was used as a sample to analyze the composition of the piezoelectric layered film 110 along the depth direction (thickness direction) through Auger analysis. In addition, a broken-out section of the piezoelectric layered film 110 was observed with a scanning electron microscope. FIG. 4A shows an enlarged scanning electron micrograph of the broken-out section of the piezoelectric layered film 110, and FIG. 4B is a partly enlarged view of FIG. 4A.

As a result of the aforementioned analyses and observations, the iridium electrode used as the first electrode film 102 was found to be an aggregate of columnar grains with a cross-sectional diameter of 20 nm. The first and second piezoelectric films 103 and 104 were present as aggregates of columnar grains mutually continuously linked. The first piezoelectric film 103 had a thickness of 50 nm, and the cross-sectional diameter of its columnar grain was 40 nm. The second piezoelectric film 104 had a thickness of 3500 nm, and the cross-sectional diameter of its columnar grain was 160 nm. The ratio l/d of the thickness l of the piezoelectric layered film 110 to the cross-sectional diameter d of the columnar grain of the second piezoelectric film 104 was 22.2.

Furthermore, as a result of the analysis through the X-ray diffraction method, the first and second piezoelectric films 103 and 104 were found to have the perovskite type crystal structure. The (001) crystal orientation ratio on the deposited face of the first piezoelectric film 103 was 70% and the (001) crystal orientation ratio on the deposited face of the second piezoelectric film 104 was 98%. At this point, the (001) crystal orientation ratio of a PZT-based piezoelectric film obtained on the basis of the refraction intensities of respective crystal faces of a diffraction pattern obtained through the X-ray diffraction method was defined as a percentage of a sum of the (001) peak intensity and the (002) peak intensity to a sum of all the peak intensities derived from the PZT-based piezoelectric film in the X-ray diffraction range of an interstitial distance of 4.2 Å (angstrom) to 1.5 Å. In other words, the (001) crystal orientation ratio is a percentage of the peak intensity of the X-ray diffraction pattern derived from the (001) plane to the sum of the peak intensities derived from the respectively crystal faces such as the (001), (100), (010), (110), (011), (101) and (111) planes.

Furthermore, as a result of the composition analysis of cation through the X-ray microanalyzer, the composition ratios of Pb:Zr:Ti of the first piezoelectric film 103 and the second piezoelectric film 104 were found to be 1.15:0.53: 0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

Moreover, a triangle wave voltage of 0 V to −80 V was applied through the leads 8 and 9 between the first and second electrode films 2 and 5, so as to measure the displacement in the vertical movement along the Z-axis direction of the tip of the piezoelectric element 20 by using a laser Doppler vibrometer. FIG. 5 shows the displacement in the vertical movement along the Z-axis direction of the tip of the piezoelectric element 20 obtained under application of a voltage of a frequency of 2 kHz.

As shown in FIG. 5, when the triangle wave voltage was applied, the tip of the piezoelectric element 20 was displaced by 38.0 μm at most. After the piezoelectric element 20 was driven by using the triangle wave voltage to reciprocate one hundred million times (corresponding to the driving time of 13.9 hours) or a billion times (corresponding to the driving time of 138.9 hours), the driving condition of the piezoelectric element 20 was examined and the appearance of the piezoelectric element 20 was observed with a light microscope. As a result, the piezoelectric element 20 was found to have the displacement of 38.0 μm and neither film peeling nor cracks was found even after being driven a billion times.

EXAMPLE 2

In this example, a Pyrex glass substrate with resistance to high temperature was used as the substrate 101 and a platinum (Pt) thin film with a thickness of 150 nm was used as the first electrode film 102. This platinum thin film was deposited by using a ternary rf-magnetron sputtering system. Specifically, the Pyrex glass substrate 101 was previously annealed to 400° C. and the temperature was kept. A mixed gas of argon and oxygen (with a gas volume ratio of Ar:$O_2$ of 15:1) was used as a sputtering gas and a total gas pressure was kept at 0.25 Pa. Platinum was used as a first target of the ternary magnetron sputtering system. The sputtering was performed for 1080 seconds under application of high frequency power of 200 W, thereby depositing the platinum thin film (without using second and third targets).

The thickness of the piezoelectric layered film 110 was set to 5100 nm. The piezoelectric layered film 110 was composed of a first piezoelectric film 103 with a thickness of 100 nm made of PZT with the (001) preferred orientation and a second piezoelectric film 104 with a thickness of 5000 nm made of PZT with the (001) preferred orientation and formed on the first piezoelectric film 103.

In this example, the first and second piezoelectric films 103 and 104 were deposited by using an rf-magnetron sputtering system in the same manner as in Example 1 (as shown in FIG. 2B). At this point, a sintered body with a diameter of 6 inches of PZT with a stoichiometric composition prepared by excessively adding approximately 10 mol % of PbO (having a composition molar ratio of Pb:Zr:Ti of 1.10:0.50:0.50) was used as a target. Also, the first and second piezoelectric films 103 and 104 were deposited under the following conditions: In a deposition chamber provided with the target, the substrate 101 having the first electrode film 102 on one face thereof was previously annealed to 550° C. and the substrate temperature was kept. A mixed gas of argon and oxygen (with a gas volume ratio of Ar:$O_2$ of 79:1) was used as a sputtering gas, and the gas pressure and the flow rate were set to 0.25 Pa and 40 ml/min., respectively. With plasma generating power set to 2 kW, the first piezoelectric film 103 was deposited for 60 seconds. Thereafter, the deposition was once stopped, the temperature of the substrate 101 was changed to 590° C. and the plasma generating power was changed to 3 kW without changing the other deposition conditions, and the second piezoelectric film 104 was deposited for 3800 seconds.

As a result of the analyses and observations the same as those carried out in Example 1, the platinum electrode used as the first electrode film 102 was found to be an aggregate of columnar grains with a cross-sectional diameter of 30 nm. The first and second piezoelectric films 103 and 104 were present as aggregates of columnar grains mutually continuously linked. The first piezoelectric film 103 had a thickness of 100 nm, and the cross-sectional diameter of its columnar grain was 40 nm. The second piezoelectric film 104 had a thickness of 5000 nm, and the cross-sectional diameter of its columnar grain was 85 nm. The ratio l/d of the thickness l of the piezoelectric layered film 110 to the cross-sectional diameter d of the columnar grain of the second piezoelectric film 104 was 60.0.

Furthermore, as a result of the analysis through the X-ray diffraction method, the first and second piezoelectric films 103 and 104 were found to have the perovskite type crystal structure. The (001) crystal orientation ratio on the deposited face of the first piezoelectric film 103 was 50%, and the (001) crystal orientation ratio on the deposited face of the second piezoelectric film 104 was 95%.

Furthermore, as a result of the composition analysis of cation through the X-ray microanalyzer, the composition ratios of Pb:Zr:Ti of the first piezoelectric film 103 and the second piezoelectric film 104 were found to be 1.15:0.51: 0.49 and 1.10:0.51:0.49, respectively. In other words, in the same manner as in Example 1, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

Moreover, in the same manner as in Example 1, a triangle wave voltage of 0 V to −80 V (with a frequency of 2 kHz) was applied through the piezoelectric element 20, so as to measure the displacement in the vertical movement along the Z-axis direction of the tip of the piezoelectric element 20. As a result, the tip of the piezoelectric element 20 was displaced by 35.2 μm at most. Even after driving the piezoelectric element 20 a billion times, the displacement was not changed and neither film peeling nor cracks was found.

EXAMPLE 3

In this example, a heat resistant stainless steel substrate with a mirror finished face was used as the substrate 101 and an alloy thin film of iridium (Ir) including titanium (Ti) with a thickness of 110 nm was used as the first electrode film 102. This alloy thin film was deposited by using a ternary rf-magnetron sputtering system. Specifically, the stainless steel substrate 101 was previously annealed to 400° C. and the temperature was kept. A mixed gas of argon and oxygen (with a gas volume ratio of Ar:$O_2$ of 16:1) was used as a sputtering gas and a total gas pressure was kept at 0.25 Pa. Iridium was used as a first target and titanium was used as a second target of the ternary magnetron sputtering system. The sputtering was performed for 960 seconds under application of high frequency power of 200 W and 60 W respectively to the first and second targets, thereby depositing the alloy thin film (without using a third target).

The thickness of the piezoelectric layered film 110 was set to 4000 nm. The piezoelectric layered film 110 was composed of a first piezoelectric film 103 with a thickness of 100 nm made of PZT with the (001) preferred orientation and a second piezoelectric film 104 with a thickness of 3900 nm made of PZT with the (001) preferred orientation and formed on the first piezoelectric film 103.

In this example, the first and second piezoelectric films 103 and 104 were deposited by using an rf-magnetron sputtering system in the same manner as in Example 1 (as shown in FIG. 2B). At this point, a sintered body with a diameter of 6 inches of PZT with a stoichiometric composition prepared by excessively adding approximately 10 mol % of PbO (having a composition molar ratio of Pb:Zr:Ti of 1.10:0.60:0.40) was used as a target. Also, the first and second piezoelectric films 103 and 104 were deposited under the following conditions: In a deposition chamber provided with the target, the substrate 101 having the first electrode film 102 on one face thereof was previously annealed to 570° C. and the substrate temperature was kept. A mixed gas of argon and oxygen (with a gas volume ratio of Ar:$O_2$ of 38:2) was used as a sputtering gas, and the gas pressure and the flow rate were set to 0.25 Pa and 40 ml/min., respectively. With plasma generating power set to 3 kW, the first piezoelectric film 103 was deposited for 100 seconds. Thereafter, the deposition was once stopped, the mixing ratio (the gas volume ratio) of Ar:$O_2$ of the sputtering gas alone was changed to 79:1 without changing the other deposition conditions, and the second piezoelectric film 104 was deposited for 2500 seconds.

As a result of the analyses and observations the same as those carried out in Example 1, the first electrode film 102 was found to be made of an iridium thin film including 1 mol % of titanium and be an aggregate of columnar grains with a cross-sectional diameter of 20 nm. The first and second piezoelectric films 103 and 104 were present as aggregates of columnar grains mutually continuously linked. The first piezoelectric film 103 had a thickness of 100 nm, and the cross-sectional diameter of its columnar grain was 70 nm. The second piezoelectric film 104 had a thickness of 3900 nm, and the cross-sectional diameter of its columnar grain was 200 nm. The ratio l/d of the thickness l of the piezoelectric layered film 110 to the cross-sectional diameter d of the columnar grain of the second piezoelectric film 104 was 20.0.

Furthermore, as a result of the analysis through the X-ray diffraction method, the first and second piezoelectric films 103 and 104 were found to have the perovskite type crystal structure. The (001) crystal orientation ratio on the deposited face of the first piezoelectric film 103 was 80%, and the (001) crystal orientation ratio on the deposited face of the second piezoelectric film 104 was 100%.

Furthermore, as a result of the composition analysis of cation through the X-ray microanalyzer, the composition ratios of Pb:Zr:Ti of the first piezoelectric film 103 and the second piezoelectric film 104 were found to be 1.05:0.60: 0.40 and 1.00:0.60:0.40, respectively. In other words, in the same manner as in Example 1, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

Moreover, in the same manner as in Example 1, a triangle wave voltage of 0 V to −80 V (with a frequency of 2 kHz) was applied through the piezoelectric element 20, so as to measure the displacement in the vertical movement along the Z-axis direction of the tip of the piezoelectric element 20. As a result, the tip of the piezoelectric element 20 was displaced by 38.3 μm at most. Even after driving the piezoelectric element 20 a billion times, the displacement was not changed and neither film peeling nor cracks was found.

EXAMPLE 4

In this example, mirror finished ceramic (alumina) was used as the substrate 101 and an alloy thin film of platinum (Pt) including nickel (Ni) with a thickness of 120 nm was used as the first electrode film 102. This alloy thin film was deposited by using a ternary rf-magnetron sputtering system. Specifically, the substrate 101 was previously annealed to 400° C. and the temperature was kept. A mixed gas of argon and oxygen (with a gas volume ratio of Ar:$O_2$ of 16:1) was used as a sputtering gas and a total gas pressure was kept at 0.25 Pa. Platinum was used as a first target and nickel was used as a second target of the ternary magnetron sputtering system. The sputtering was performed for 960 seconds under application of high frequency power of 200 W and 60 W respectively to the first and second targets, thereby depositing the alloy thin film (without using a third target).

The thickness of the piezoelectric layered film 110 was set to 2505 nm. The piezoelectric layered film 110 was composed of a first piezoelectric film 103 with a thickness of 5 nm made of PZT with the (001) preferred orientation and a second piezoelectric film 104 with a thickness of 2500 nm made of PZT with the (001) preferred orientation and formed on the first piezoelectric film 103.

In this example, the first and second piezoelectric films 103 and 104 were deposited by using an rf-magnetron sputtering system in the same manner as in Example 1 (as shown in FIG. 2B). At this point, a sintered body with a diameter of 6 inches of PZT with a stoichiometric composition prepared by excessively adding approximately 20 mol % of PbO (having a composition molar ratio of Pb:Zr:Ti of 1.20:0.54:0.46) was used as a target. Also, the first and second piezoelectric films 103 and 104 were deposited under the following conditions: In a deposition chamber provided with the target, the substrate 101 having the first electrode film 102 on one face thereof was previously annealed to 550° C. and the substrate temperature was kept. A mixed gas of argon and oxygen (with a gas volume ratio of Ar:$O_2$ of 79:1) was used as a sputtering gas, and the gas pressure and the flow rate were set to 0.2 Pa and 40 ml/min., respectively. With plasma generating power set to 2 kW, the first piezoelectric film 103 was deposited for 5 seconds. Thereafter, the deposition was once stopped, the temperature of the substrate 101 was changed to 580° C. and the plasma generating power was changed to 3 kW without changing the other deposition conditions, and the second piezoelectric film 104 was deposited for 2000 seconds.

As a result of the analyses and observations the same as those carried out in Example 1, the first electrode film 102 was found to be made of platinum including 4 mol % of nickel and be an aggregate of columnar grains with a cross-sectional diameter of 25 nm. The first and second piezoelectric films 103 and 104 were present as aggregates of columnar grains mutually continuously linked. The first piezoelectric film 103 had a thickness of 5 nm, and the cross-sectional diameter of its columnar grain was 40 nm. The second piezoelectric film 104 had a thickness of 2500 nm, and the cross-sectional diameter of its columnar grain was 60 nm. The ratio l/d of the thickness l of the piezoelectric layered film 110 to the cross-sectional diameter d of the columnar grain of the second piezoelectric film 104 was 41.7.

Furthermore, as a result of the analysis through the X-ray diffraction method, the first and second piezoelectric films 103 and 104 were found to have the perovskite type crystal structure. The (001) crystal orientation ratio on the deposited face of the first piezoelectric film 103 was 80%, and the (001) crystal orientation ratio on the deposited face of the second piezoelectric film 104 was 99.0%.

Furthermore, as a result of the composition analysis of cation through the X-ray microanalyzer, the composition ratios of Pb:Zr:Ti of the first piezoelectric film 103 and the second piezoelectric film 104 were found to be 1.10:0.54:0.46 and 1.05:0.54:0.46, respectively. In other words, in the same manner as in Example 1, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

Moreover, in the same manner as in Example 1, a triangle wave voltage of 0 V to −80 V (with a frequency of 2 kHz) was applied through the piezoelectric element 20, so as to measure the displacement in the vertical movement along the Z-axis direction of the tip of the piezoelectric element 20. As a result, the tip of the piezoelectric element 20 was displaced by 32.7 μm at most. Even after driving the piezoelectric element 20 a billion times, the displacement was not changed and neither film peeling nor cracks was found.

EXAMPLE 5

In this example, a silicon substrate was used as the substrate 101 and an alloy thin film of iridium (Ir) including cobalt (Co) with a thickness of 120 nm was used as the first electrode film 102. This alloy thin film was deposited by using a ternary rf-magnetron sputtering system. Specifically, the silicon substrate 101 was previously annealed to 400° C. and the temperature was kept. A mixed gas of argon and oxygen (with a gas volume ratio of Ar:$O_2$ of 16:1) was used as a sputtering gas and a total gas pressure was kept at 0.25 Pa. Iridium was used as a first target and cobalt was used as a second target of the ternary rf-magnetron sputtering system. The sputtering was performed for 960 seconds under application of high frequency power of 200 W and 60 W respectively to the first and second targets, thereby depositing the alloy thin film (without using a third target).

The thickness of the piezoelectric layered film 110 was set to 4580 nm. The piezoelectric layered film 110 was composed of a first piezoelectric film 103 with a thickness of 80 n=made of PZT with the (001) preferred orientation and a second piezoelectric film 104 with a thickness of 4500 nm made of PZT with the (001) preferred orientation and formed on the first piezoelectric film 103.

In this example, the first and second piezoelectric films 103 and 104 were deposited by using a ternary rf-magnetron sputtering system in the same manner as in Example 1 (as shown in FIG. 2B). At this point, a sintered body with a diameter of 6 inches of PZT with a stoichiometric composition prepared by excessively adding approximately 20 mol % of PbO (having a composition molar ratio of Pb:Zr:Ti of 1.20:0.53:0.47) was used as a target. Also, the first and second piezoelectric films 103 and 104 were deposited under the following conditions: In a deposition chamber provided with the target, the substrate 101 having the first electrode film 102 on one face thereof was previously annealed to 580° C. and the substrate temperature was kept. A mixed gas of argon and oxygen (with a gas volume ratio of Ar:$O_2$ of 38:2) was used as a sputtering gas, and the gas pressure and the flow rate were set to 0.2 Pa and 40 ml/min., respectively. With plasma generating power set to 3 kW, the first piezoelectric film 103 was deposited for 75 seconds. Thereafter, the deposition was once stopped, the mixing ratio of Ar:$O_2$ of the sputtering gas alone was changed to 79:1 without changing the other deposition conditions, and the second piezoelectric film 104 was deposited for 3700 seconds.

As a result of the analyses and observations the same as those carried out in Example 1, the first electrode film 102 was found to be made of an iridium thin film including 4 mol % of cobalt and be an aggregate of columnar grains with a cross-sectional diameter of 20 nm. The first and second piezoelectric films 103 and 104 were present as aggregates of columnar grains mutually continuously linked. The first piezoelectric film 103 had a thickness of 80 nm, and the cross-sectional diameter of its columnar grain was 50 nm. The second piezoelectric film 104 had a thickness of 4500 nm, and the cross-sectional diameter of its columnar grain was 150 nm. The ratio l/d of the thickness l of the piezoelectric layered film 110 to the cross-sectional diameter d of the columnar grain of the second piezoelectric film 104 was 30.5.

Furthermore, as a result of the analysis through the X-ray diffraction method, the first and second piezoelectric films 103 and 104 were found to have the perovskite type crystal structure. The (001) crystal orientation ratio on the deposited face of the first piezoelectric film 103 was 70%, and the (001) crystal orientation ratio on the deposited face of the second piezoelectric film 104 was 99.0%.

Furthermore, as a result of the composition analysis of cation through the X-ray microanalyzer, the composition ratios of Pb:Zr:Ti of the first piezoelectric film 103 and the second piezoelectric film 104 were found to be 1.10:0.53:0.47 and 1.05:0.53:0.47, respectively. In other words, in the same manner as in Example 1, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

Moreover, in the same manner as in Example 1, a triangle wave voltage of 0 V to −80 V (with a frequency of 2 kHz)

was applied through the piezoelectric element 20, so as to measure the displacement in the vertical movement along the Z-axis direction of the tip of the piezoelectric element 20. As a result, the tip of the piezoelectric element 20 was displaced by 41.5 μm at most. Even after driving the piezoelectric element 20 a billion times, the displacement was not changed and neither film peeling nor cracks was found.

Although the PZT film made of a ternary oxide of Pb, Zr and Ti was used as the piezoelectric layered film 10 in each of the aforementioned examples, any other film such as a PZT film including La (namely, a PLZT film) and a PZT film including ions of Nb and Mg may be used instead as far as it is an oxide thin film with the perovskite type crystal structure including at least Pb, Zr and Ti. In the case where the piezoelectric layered film 10 is made of an oxide thin film with the perovskite type crystal structure, the piezoelectric layered film 10 attains the function and effect similar to those described in the aforementioned examples.

Comparative Example 1

For comparison with the above-described examples, the following piezoelectric element was fabricated as Comparative Example 1. In this comparative example, a monolayer piezoelectric film was formed instead of the piezoelectric layered film. The piezoelectric film was deposited in the same manner as the second piezoelectric film 104 of Example 1. Apart from this, the piezoelectric element of Comparative Example 1 was the same as that of in Example 1.

The piezoelectric element was observed on its surface with a scanning electron microscope and analyzed in its composition through the X-ray diffraction and the X-ray microanalyzer in the same manner as in Example 1, and was broken so as to observe a broken-out section with a scanning electron microscope.

As a result of the analyses and observations the same as those carried out in Example 1, the piezoelectric film of this comparative example was found to be an aggregate of columnar grains. The piezoelectric film had a thickness of 3500 nm, and the cross-sectional diameter of the columnar grain was 230 nm. The ratio l/d of the thickness l of the piezoelectric film to the cross-sectional diameter d of the columnar grain of the piezoelectric film was 15.2.

Furthermore, as a result of the analysis through the X-ray diffraction method, the piezoelectric film was found to have the perovskite type crystal structure and have the (001) crystal orientation ratio of 45%.

Also, as a result of the composition analysis of cation through the X-ray microanalyzer, the composition ratio of Pb:Zr:Ti of the piezoelectric film was found to be 1.05:0.53:0.47.

Moreover, as a result of the Auger spectroscopy, the composition distribution of Zr and Ti along the depth direction of the piezoelectric film was found to be constant from the interface in contact with the second electrode film to the interface in contact with the first electrode film, and the composition ratio of Pb was smaller in a portion with a length of approximately 10 nm from the interface in contact with the first electrode film (namely, a portion corresponding to approximately 1/15 of the whole piezoelectric film) than in the other portion. This phenomenon seems to be caused because the Pb was very slightly distributed in the first electrode film. In other words, the piezoelectric film of this comparative example is a PZT film with the perovskite type crystal structure made of an aggregate of columnar grains grown vertically to the top face of the substrate similarly to that of Example 1, but this piezoelectric film was different from that of Example 1 in the following points: The cross-sectional diameter of the columnar grain was larger than that of Example 1; the (001) crystal orientation ratio is smaller than that of Example 1; and the Pb composition ratio is slightly smaller on the interface in contact with the first electrode film than in the other portion.

Furthermore, a triangle wave voltage of 0 V through −80 V (with a frequency of 2 kHz) was applied through the piezoelectric element in the same manner as in Example 1, so as to measure the displacement in the vertical movement along the Z-axis direction of the tip of the piezoelectric element. As a result, the tip of the piezoelectric element was displaced by 20.0 μm at most. After the piezoelectric element was driven by using the triangle wave voltage one hundred million times, the driving condition of the piezoelectric element was examined and the appearance of the piezoelectric element was observed with a light microscope. As a result, it was found that the driving of the piezoelectric element had been stopped and that film peeling was caused between the first electrode film and the piezoelectric film.

Comparative Example 2

For comparison with the above-described examples, the following piezoelectric element was fabricated as Comparative Example 2. In this comparative example, a monolayer piezoelectric film was formed instead of the piezoelectric layered film. The piezoelectric film was deposited in the same manner as the second piezoelectric film 104 of Example 5. Apart from this, the piezoelectric element of Comparative Example 1 was the same as that of Example 5.

The piezoelectric element was observed on its surface with a scanning electron microscope and analyzed in its composition through the X-ray diffraction and the X-ray microanalyzer and was broken so as to observe a broken-out section with a scanning electron microscope in the same manner as in Example 5.

As a result of the analyses and observations the same as those carried out in Example 5, the piezoelectric film of this comparative example was found to be an aggregate of columnar grains. The piezoelectric film had a thickness of 4500 nm, and the cross-sectional diameter of the columnar grain was 230 nm. The ratio l/d of the thickness l of the piezoelectric film to the cross-sectional diameter d of the colunmar grain of the piezoelectric film was 19.6.

Furthermore, as a result of the analysis through the X-ray diffraction method, the piezoelectric film was found to have the perovskite type crystal structure and have the (001) crystal orientation ratio of 96%.

Also, as a result of the composition analysis of cation through the X-ray microanalyzer, the composition ratio of Pb:Zr:Ti of the piezoelectric film was found to be 1.05:0.53:0.47.

Moreover, as a result of the Auger spectroscopy, the composition distribution of Zr and Ti along the depth direction of the piezoelectric film was found to be constant from the interface in contact with the second electrode film to the interface in contact with the first electrode film, and the composition ratio of Pb was smaller in a portion with a length of approximately 10 mm from the interface in contact with the first electrode film (namely, a portion corresponding to approximately 1/20 of the whole piezoelectric film) than in the other portion. This phenomenon, which could not be observed with the degree of accuracy of the Auger spectroscopy, seems to be caused because the Pb was very slightly distributed in the first electrode film. In other words, the piezoelectric film of this comparative example is a PZT film with the perovskite type crystal structure made of an aggregate of columnar grains grown vertically to the top face of the substrate similarly to that of Example 5, but this piezoelectric film was different from that of Example 5 in the following points: The cross-sectional diameter of the columnar grain was larger than that of Example 5; and the Pb composition ratio is slightly smaller on the interface in contact with the first electrode film than in the other portion.

Furthermore, a triangle wave voltage of 0 V through −80 V (with a frequency of 2 kHz) was applied through the piezoelectric element in the same manner as in Example 5, so as to measure the displacement in the vertical movement along the Z-axis direction of the tip of the piezoelectric element. As a result, the tip of the piezoelectric element was displaced by 38.0 μm at most. After the piezoelectric element was driven by using the triangle wave voltage a billion times, the driving condition of the piezoelectric element was examined and the appearance of the piezoelectric element was observed with a light microscope. As a result, it was found that the driving of the piezoelectric element had been stopped and that film peeling was caused between the first electrode film and the piezoelectric film.

Effects

As described so far, according to this embodiment, adhesion between the first electrode film 2 and the first piezoelectric film 3 is improved. Therefore, even when a high voltage is applied, film peeling is never caused between the first electrode film 2 and the first piezoelectric film 3. Accordingly, the piezoelectric element 20 attains high piezoelectric properties and is free from degradation.

Furthermore, the first electrode film 2 activates the function of the first piezoelectric film 3 as the crystal orientation controlling film. Therefore, the first piezoelectric film 3 can definitely control the crystal orientation of the second piezoelectric film 4.

Embodiment 2

Figure 6:
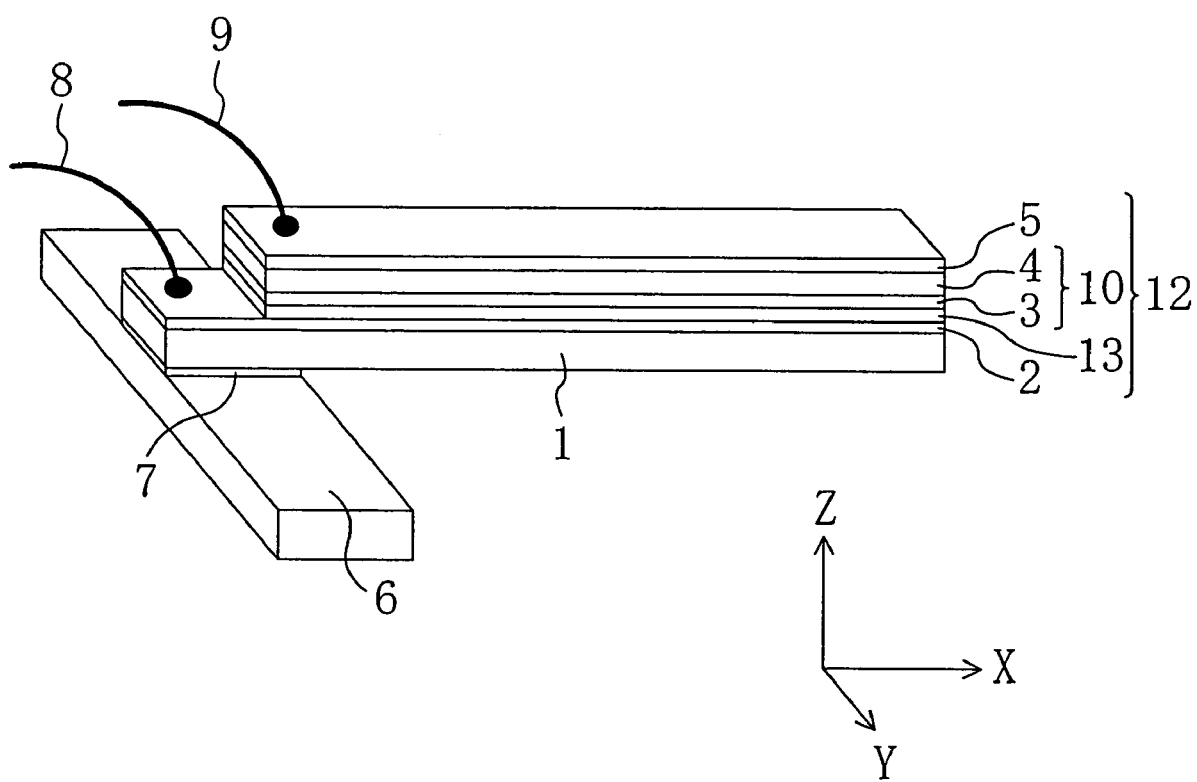
FIG. 6 is a perspective view of a piezoelectric element according to another embodiment.

A piezoelectric element 21 according to Embodiment 2 of the invention is in the shape similar to that of Example 1 and includes, as shown in FIG. 6, a substrate 1 in the shape of a strip (with a thickness of 0.30 mm, a width of 3.0 mm and a length of 15.0 mm) and a layered body 12 formed on the substrate 1. The piezoelectric element 21 has a width of 3.0 mm. One end portion along the longitudinal direction of the piezoelectric element 21 (that is, the left end portion in FIG. 6) is fixed on a stainless steel supporting substrate 6 (with a thickness of 1.0 mm, a width of 3.0 mm and a length of 10.0 mm) with an epoxy resin adhesive 7. The end portion herein means a portion with a length of 3.0 mm from the end of the piezoelectric element 21 (that is, the left end in FIG. 6). The longitudinal direction of the piezoelectric element 21 is substantially perpendicular to the longitudinal direction of the stainless steel supporting substrate 6. Thus, the piezoelectric element 21 is constructed as a cantilever.

The piezoelectric element 21 has the same structure as the piezoelectric element 20 of Embodiment 1 except that the layered body 12 of the piezoelectric element 21 includes a buffer layer film 13 between the first electrode film 2 and the piezoelectric layered film 10.

The layered body 12 includes the first electrode film 2 formed on the substrate 1, the buffer layer film 13 formed on the first electrode film 2, the piezoelectric layered film 10 formed on the buffer layer film 13, and the second electrode film 5 formed on the piezoelectric layered film 10.

The first electrode film 2 is formed over one face of the substrate 1. The buffer layer film 13 is formed on the first electrode film 2 excluding the aforementioned end portion, and the piezoelectric layered film 10 is formed on the buffer layer film 13. Specifically, each of the buffer layer film 13 and the piezoelectric layered film 10 has a width of 3.0 mm and a length of 12.0 mm. The buffer layer film 13 has a function as a crystal orientation controlling film for controlling the crystal orientation of the first piezoelectric film 3 described below as well as a function as an underlying film for enabling the first piezoelectric film 3 to be deposited at a low temperature. The piezoelectric layered film 10 includes the first piezoelectric film 3 formed on the buffer layer film 13 and the second piezoelectric film 4 formed on the first piezoelectric film 3. The first piezoelectric film 3 has a function as a crystal orientation controlling film for controlling the crystal orientation of the second piezoelectric film 4 in the same manner as in Embodiment 1.

As a characteristic of this invention, each of the first and second piezoelectric films 3 and 4 is an aggregate of columnar grains having a crystal growth direction unidirectionally along the thickness direction of the piezoelectric layered film (the first and second piezoelectric films 3 and 4) similarly to the piezoelectric layered film 10 of Embodiment 1. Also similarly to Embodiment 1, the cross-sectional diameter of the columnar grain of the second piezoelectric film 4 is larger than the cross-sectional diameter of the columnar grain of the first piezoelectric film 3. A ratio l/d of the thickness l of the piezoelectric layered film 10 (i.e., the length of the columnar grains of the piezoelectric layered film 10) to the cross-sectional diameter d of the columnar grain of the second piezoelectric film 4 is not less than 20 and not more than 60. Similarly to Embodiment 1, when the ratio l/d is smaller than 20, cracks are disadvantageously caused in the piezoelectric layered film 10 due to stress caused in deposition, and when the ratio l/d exceeds 60, the responsibility is disadvantageously lowered because power consumed in driving is large.

It is noted that the buffer layer film 13 is also an aggregate of columnar grains. The first piezoelectric film 3 and the buffer layer film 13 are linked to each other as the aggregates of the columnar grains.

The columnar grain of each of the buffer layer film 13 and the first piezoelectric film 3 has a cross-sectional diameter not less than 40 nm and not more than 70 nm and a length not less than 5 nm and not more than 100 nm. The columnar grain of the second piezoelectric film 4 has a cross-sectional diameter not less than 60 nm and not more than 200 nm and a length not less than 2500 nm and not more than 5000 nm.

Also, the buffer layer film 13 is an oxide thin film with the perovskite type crystal structure and has the (001) crystal orientation ratio not less than 50% and not more than 80%.

Furthermore, the (001) crystal orientation ratio of the first piezoelectric film 3 is also not less than 50% and not more than 80%. The (001) crystal orientation ratio of the second piezoelectric film 4 is not less than 95% and not more than 100%.

Also, a chemical composition ratio of Pb:Zr:Ti of each of the first and second piezoelectric films 3 and 4 is represented by $(1+a):b:(1-b)$. The value b is not less than 0.50 and not more than 0.60 in the first and second piezoelectric films 3 and 4. The value a is not less than 0 and not more than 0.15 in the first and second piezoelectric films 3 and 4. In the piezoelectric layered film 10 of this embodiment, the Pb content in the first piezoelectric film 3 is not necessarily larger than that in the second piezoelectric film 4 as in the piezoelectric layered film 10 of Embodiment 1.

Also similarly to Embodiment 1, the first electrode film 2 is made of a noble metal of Pt or Ir, or an alloy of the noble metal including at least one of Ti, Co and Ni, and is an aggregate of columnar grains having the crystal growth direction unidirectionally along the thickness direction of the first electrode film 2 and having a cross-sectional diameter not less than 20 nm and not more than 30 nm.

When a voltage is applied to the leads 8 and 9 of the piezoelectric element 21, the tip of the piezoelectric element 21 is displaced toward the −Z direction along the Z-axis as in Embodiment 1. Accordingly, when the voltage application is repeated at constant periods, the tip of the piezoelectric element 21 is displaced along the Z-axis direction with a given displacement range, and thus, the displacement property of the piezoelectric element 21 can be evaluated.

Fabrication Method for Piezoelectric Element

Figure 7A:
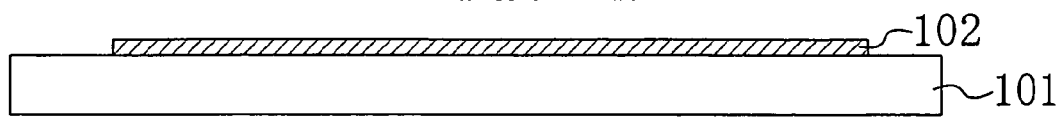
FIGS. 7A, 7B, 7C, 7D and 7E are diagrams for showing procedures for fabricating the piezoelectric element of FIG. 6.

Now, the method for fabricating the piezoelectric element 21 will be described with reference to FIGS. 7A through 7E. First, as shown in FIG. 7A, a silicon substrate 101 having a first electrode film 102 formed on one face thereof, which is the same as that of Embodiment 1 shown in FIG. 2A, is prepared. Next, on the silicon substrate 101 (with a length of 20 mm, a width of 20 mm and a thickness of 0.30 mm) whose (001) plane has been polished, a first electrode film 102 is deposited by rf-magnetron sputtering by using a stainless steel mask (with a thickness of 0.2 mm) having a rectangular opening with a width of 5.0 mm and a length of 18.0 mm.

Next, a buffer layer film 113 is deposited on the first electrode film 102 by the rf-magnetron sputtering using a sintered body of lead lanthanum titanate as a target by using a stainless steel mask (with a thickness of 0.2 mm) having a rectangular opening with a width of 5.0 mm and a length of 12.0 mm. Furthermore, a piezoelectric layered film 110 is accurately deposited on the buffer layer film 113. Specifically, the piezoelectric layered film 110 is deposited as follows: First, a first piezoelectric film 103 is deposited on the buffer layer film 113 by the rf-magnetron sputtering performed under given deposition conditions by using a sintered body of a PZT oxide as a target. Then, a second piezoelectric film 104 is continuously deposited on the first piezoelectric film 103 by the rf-magnetron sputtering performed under deposition conditions different from those employed for forming the first piezoelectric film 103 and by using the same target as that used in forming the first piezoelectric film 103.

Figure 7B:
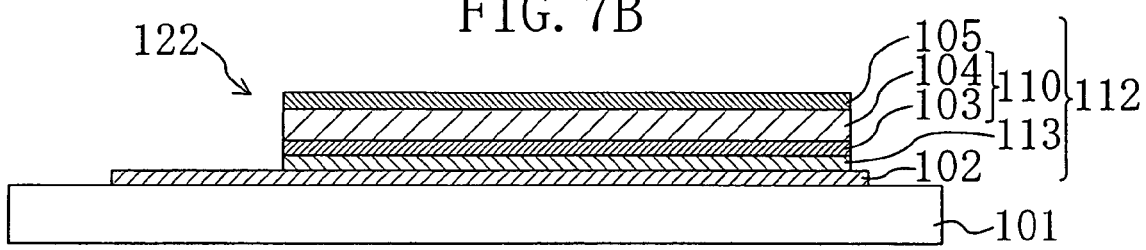

Thereafter, a second electrode film 105 is accurately deposited on the piezoelectric layered film 110 by the rf-magnetron sputtering by using a stainless steel mask in the same shape as that of the above-described mask. In this manner, as shown in FIG. 7B, a structure 122 composed of the substrate 101 and a layered body 112 including the buffer layer film 113 and the piezoelectric layered film 110 formed on the substrate 101 is obtained.

Figure 7C:
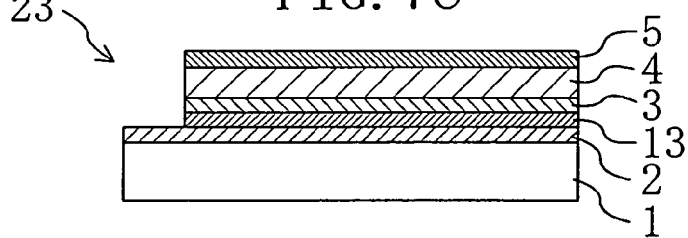

Next, as shown in FIG. 7C, the structure 122 is accurately cut with a dicing saw so that the resultant can be in the shape of a strip with a width of 3.0 mm and a length of 15.0 mm and that a portion with a length of 3.0 mm from one end (i.e., the left end in FIG. 7C) of a first electrode film 2 can be exposed. As a result, a piezoelectric element structure component 23 in which the first electrode film 2, a buffer layer film 13, first and second piezoelectric films 3 and 4 and a second electrode film 5 are stacked on a substrate 1 in this order can be obtained.

Figure 7D:
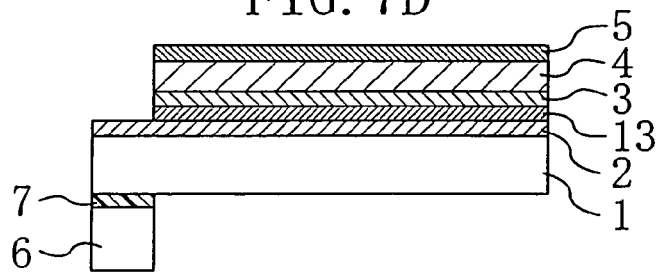

Then, as shown in FIG. 7D, the exposed portion of the first electrode film 2 above the substrate 1 (i.e., the left end portion in FIG. 7D) is jointed on a stainless steel supporting substrate 6 with an epoxy resin adhesive 7.

Figure 7E:
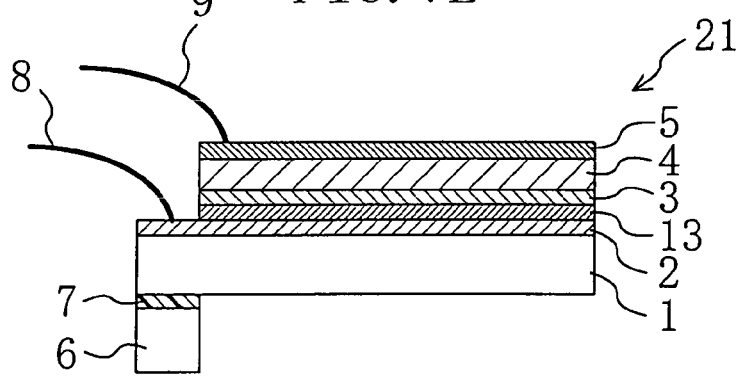

Next, as shown in FIG. 7E, a lead 8 of gold of 0.1 mm is connected to the exposed portion of the first electrode film 2 with a conductive adhesive (conductive paste containing silver), and a lead 9 is connected to a portion of the second electrode film 5 close to the exposed portion of the first electrode film 2 by wire bonding. Thus, the piezoelectric element 21 as shown in FIG. 7E is obtained.

Although the silicon substrate is used as the substrate in this embodiment, any material other than silicon may be used instead as far as it is not deformed through annealing at 500° C. or more.

Now, specifically practiced examples of this embodiment will be described.

EXAMPLE 6

In this example, a silicon substrate 101 and a first electrode film 102 prepared in the same manner as in Example 1 were used. Specifically, a silicon substrate was used as the substrate 101 and an iridium (Ir) thin film with a thickness of 100 nm was used as the first electrode film 102.

A buffer layer film 113 was deposited on the first electrode film 102. The buffer layer film 113 was deposited by using, as a target, a sintered body (with a diameter of 4 inches) prepared by excessively adding 10 mol % of lead oxide (PbO) to lead lanthanum titanate including 14 mol % of lanthanum (La) (with a chemical composition of $(Pb_{0.86}La_{0.14})TiO_3$). The buffer layer film 113 was deposited for 300 seconds at a substrate temperature of 500° C. in a mixed atmosphere of argon and oxygen (with a gas volume ratio of $Ar:O_2$ of 19:1) at a degree of vacuum of 0.8 Pa with high frequency power of 300 W.

Also, the piezoelectric layered film 110 was deposited by using the rf-magnetron sputtering system used in Example 1. The piezoelectric layered film 110 was deposited by using, as a target, a sintered body with a diameter of 6 inches of PZT with a stoichiometric composition prepared by excessively adding approximately 20 mol % of PbO (having a composition molar ratio of Pb:Zr:Ti of 1.20:0.53:0.47). The piezoelectric layered film 110 was deposited under the following conditions: In a deposition chamber provided with the target, the substrate 101 having the first electrode film 102 on one face thereof was previously annealed to 540° C. and the substrate temperature was kept. The volume ratio of $Ar:O_2$ of argon-oxygen gas employed for the first piezoelectric film 103 was 38:2, and that employed for the second piezoelectric film 104 was 79:1. The flow rate of the argon-oxygen gas employed for the first and second piezoelectric films 103 and 104 was set to 40 ml/min., the degree of vacuum was set to 0.2 Pa and the high frequency power was set to 3 kW. The deposition times for the first and second piezoelectric films 103 and 104 were 50 seconds and 3190 seconds, respectively.

The thicknesses, the chemical compositions, the film structures, the crystal structures and the crystal orientations of the first electrode film 102, the buffer layer film 113 and the first and second piezoelectric films 103 and 104 of the piezoelectric layered film 110 were examined in the same manner as in Example 1.

The iridium electrode used as the first electrode film 102 was found to be an aggregate of columnar grains with a cross-sectional diameter of 20 nm.

The buffer layer film 113 was found to be a film with a columnar structure with the perovskite type crystal structure having a thickness of 100 nm, the chemical composition ratio of Pb:La:Ti of 0.90:0.14:1.00 and the (001) crystal orientation ratio of 70%.

In the piezoelectric layered film 110, the first and second piezoelectric films 103 and 104 were present as aggregates of columnar grains mutually continuously linked. The first piezoelectric film 103 had a thickness of 50 nm, and the cross-sectional diameter of its columnar grain was 40 nm. Also, the first piezoelectric film 103 was found to have the perovskite type crystal structure and the (001) crystal orientation ratio on the deposited face was 75%. The second piezoelectric film 104 had a thickness of 3850 nm, and the cross-sectional diameter of its columnar grain was 160 nm. The second piezoelectric film 104 was also found to have the perovskite type crystal structure and the (001) crystal orientation ratio on the deposited face was 99%. The ratio $l/d$ of the thickness l of the piezoelectric layered film 110 to the cross-sectional diameter d of the columnar grain of the second piezoelectric film 104 was 24.4.

Furthermore, as a result of the composition analysis of cation through the X-ray microanalyzer, the composition ratios of Pb:Zr:Ti of the first piezoelectric film 103 and the second piezoelectric film 104 were found to be 1.15:0.53: 0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed by using an evaluation apparatus similar to that used in Example 1. Specifically, a triangle wave voltage of 0 V to −100 V (with a frequency of 2 kHz) was applied through the leads 8 and 9 between the first and second electrode films 2 and 5, so as to measure the displacement in the vertical movement along the Z-axis direction of the tip of the piezoelectric element 21 by using a laser Doppler vibrometer.

When the triangle wave voltage was applied, the tip of the piezoelectric element 21 was displaced by 42.0 μm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 42.0 μm and neither film peeling nor cracks was found even after being driven a billion times.

EXAMPLE 7

In this example, a silicon substrate 101, a first electrode film 102 and a buffer layer film 113 prepared in the same manner as in Example 6 were used.

Also, the piezoelectric layered film 110 was deposited by using the rf-magnetron sputtering system used in Example 6 and the same target as that used in Example 6. The piezoelectric layered film 110 was deposited under the following conditions: In a deposition chamber provided with the target, the substrate 101 having the first electrode film 102 on one face thereof was previously annealed to 550° C. and the substrate temperature was kept. The volume ratio of $Ar:O_2$ of argon-oxygen gas employed for the first piezoelectric film 103 was 95:1, and that employed for the second piezoelectric film 104 was 79:1. The flow rate of the argon-oxygen gas employed for the first and second piezoelectric films 103 and 104 was set to 40 ml/min., the degree of vacuum was set to 0.2 Pa and the high frequency power was set to 3 kW. The deposition times for the first and second piezoelectric films 103 and 104 were 60 seconds and 3190 seconds, respectively.

The thicknesses, the chemical compositions, the film structures, the crystal structures and the crystal orientations of the first and second piezoelectric films 103 and 104 of the piezoelectric layered film 110 were examined in the same manner as in Example 6.

In the piezoelectric layered film 110, the first and second piezoelectric films 103 and 104 were present as aggregates of columnar grains mutually continuously linked. The first piezoelectric film 103 had a thickness of 60 nm, and the cross-sectional diameter of its columnar grain was 40 nm. Also, the first piezoelectric film 103 was found to have the perovskite type crystal structure and the (001) crystal orientation ratio on the deposited face was 72%. The second piezoelectric film 104 had a thickness of 3850 nm, and the cross-sectional diameter of its columnar grain was 160 nm. The second piezoelectric film 104 was also found to have the perovskite type crystal structure and the (001) crystal orientation ratio on the deposited face was 99%. The ratio l/d of the thickness l of the piezoelectric layered film 110 to the cross-sectional diameter d of the columnar grain of the second piezoelectric film 104 was 24.4.

Furthermore, as a result of the composition analysis of cation through the X-ray microanalyzer, the composition ratios of Pb:Zr:Ti of the first piezoelectric film 103 and the second piezoelectric film 104 were found to be 1.05:0.53: 0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was smaller in the first piezoelectric film 103 than in the second piezoelectric film 104.

The driving durability test for the piezoelectric displacement of the piezoelectric element was performed by using the evaluation apparatus similar to that used in Example 6. When the triangle wave voltage was applied, the tip of the piezoelectric element 21 was displaced by 40.0 μm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 40.0 μm and neither film peeling nor cracks was found even after being driven a billion times.

EXAMPLE 8

In this example, a piezoelectric element 21 was fabricated in the same manner as in Example 6 except that the deposition time for the buffer layer film 113 was changed to 600 seconds.

The buffer layer film 113 was found to be a film with a columnar structure with the perovskite type crystal structure having a thickness of 200 mm, the chemical composition ratio of Pb:La:Ti of 0.90:0.14:1.00 and the (001) crystal orientation ratio of 75%, and the average diameter of its columnar grain was 50 nm.

In the piezoelectric layered film 110, the first and second piezoelectric films 103 and 104 were present as aggregates of columnar grains mutually continuously linked. The first piezoelectric film 103 had a thickness of 50 nm, and the cross-sectional diameter of its columnar grain was 50 nm. Also, the first piezoelectric film 103 was found to have the perovskite type crystal structure and the (001) crystal orientation ratio on the deposited face was 80%. The second piezoelectric film 104 had a thickness of 3850 nm, and the cross-sectional diameter of its columnar grain was 180 nm. The second piezoelectric film 104 was also found to have the perovskite type crystal structure and the (001) crystal orientation ratio on the deposited face was 100%. The ratio l/d of the thickness l of the piezoelectric layered film 110 to the cross-sectional diameter d of the columnar grain of the second piezoelectric film 104 was 21.7.

Furthermore, as a result of the composition analysis of cation through the X-ray microanalyzer, the composition ratios of Pb:Zr:Ti of the first piezoelectric film 103 and the second piezoelectric film 104 were found to be 1.15:0.53:0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed in the same manner as in Example 6. When the triangle wave voltage was applied, the tip of the piezoelectric element 21 was displaced by 42.0 µm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 42.0 µm and neither film peeling nor cracks was found even after being driven a billion times.

EXAMPLE 9

In this example, a piezoelectric element 21 was fabricated in the same manner as in Example 6 except that the deposition time for the buffer layer film 113 was changed to 150 seconds.

The buffer layer film 113 was found to be a film with a columnar structure with the perovskite type crystal structure having a thickness of 45 nm, the chemical composition ratio of Pb:La:Ti of 0.90:0.14:1.00 and the (001) crystal orientation ratio of 55%, and the average diameter of its columnar grain was 40 nm.

In the piezoelectric layered film 110, the first and second piezoelectric films 103 and 104 were present as aggregates of columnar grains mutually continuously linked. The first piezoelectric film 103 had a thickness of 50 nm, and the cross-sectional diameter of its columnar grain was 40 nm. Also, the first piezoelectric film 103 was found to have the perovskite type crystal structure and the (001) crystal orientation ratio on the deposited face was 70%. The second piezoelectric film 104 had a thickness of 3850 run, and the cross-sectional diameter of its columnar grain was 160 nm. The second piezoelectric film 104 was also found to have the perovskite type crystal structure and the (001) crystal orientation ratio on the deposited face was 99%. The ratio l/d of the thickness l of the piezoelectric layered film 110 to the cross-sectional diameter d of the columnar grain of the second piezoelectric film 104 was 24.4.

Furthermore, as a result of the composition analysis of cation through the X-ray microanalyzer, the composition ratios of Pb:Zr:Ti of the first piezoelectric film 103 and the second piezoelectric film 104 were found to be 1.15:0.53:0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed by the same evaluation method as that employed in Example 6. When the triangle wave voltage was applied, the tip of the piezoelectric element 21 was displaced by 42.0 µm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 42.0 m and neither film peeling nor cracks was found even after being driven a billion times.

EXAMPLE 10

In this example, a Pyrex glass substrate with resistance to high temperature (having the same shape and the same composition as that used in Example 2) was used as the substrate 101, and a first electrode film 101 prepared in the same manner as in Example 4 was used. Specifically, a platinum (Pt) thin film including 4 mol % of nickel (Ni) with a thickness of 120 nm was used as the first electrode film 102.

A buffer layer film 113 was deposited on the first electrode film 102. The buffer layer film 113 was deposited by using, as a target, a sintered body (with a diameter of 4 inches) prepared by excessively adding 10 mol % of lead oxide (PbO) to lead lanthanum magnesium titanate including 12 mol % of lanthanum (La) and 6 mol % of magnesium (Mg) (with a chemical composition of $(Pb_{0.82}Mg_{0.06}La_{0.12})TiO_3$). The buffer layer film 113 was deposited for 300 seconds at a substrate temperature of 500° C. in a mixed atmosphere of argon and oxygen (with a gas volume ratio of Ar:$O_2$ of 19:1) at a degree of vacuum of 0.8 Pa with high frequency power of 300 W.

Also, a piezoelectric layered film 110 was deposited by using an rf-magnetron sputtering system as in Example 2. The piezoelectric layered film 110 was deposited by using, as a target, a sintered body with a diameter of 6 inches of PZT with a stoichiometric composition prepared by excessively adding approximately 10 mol % of PbO (having a composition molar ratio of Pb:Zr:Ti of 1.10:0.50:0.50). The piezoelectric layered film 110 was deposited under the following conditions: In a deposition chamber provided with the target, the substrate 101 having the first electrode film 102 on one face thereof was previously annealed to 530° C. and the substrate temperature was kept. A mixed gas of argon and oxygen (with a gas volume ratio of Ar:$O_2$ of 79:1) was used as the sputtering gas for the first and second piezoelectric films 103 and 104, the gas pressure was set to 0.25 Pa and the flow rate of the argon-oxygen gas was set to 40 ml/min. The first piezoelectric film 103 was deposited for 60 seconds with the plasma generating power set to 2 kW. The second piezoelectric film 104 was deposited for 3800 seconds with the plasma generating power set to 3 kW.

The thicknesses, the chemical compositions, the film structures, the crystal structures and the crystal orientations of the first electrode film 102, the buffer layer film 113 and the first and second piezoelectric films 103 and 104 of the piezoelectric layered film 110 were examined in the same manner as in Example 6.

The first electrode film 102 was found to be made of platinum including 4 mol % of nickel and to be an aggregate of columnar grains with a cross-sectional diameter of 25 nm.

The buffer layer film 113 was found to be a film with a columnar structure with the perovskite type crystal structure having a thickness of 100 nm, the chemical composition ratio of Pb:La:Mg:Ti of 0.86:0.12:0.08:1.00 and the (001) crystal orientation ratio of 65%, and the average diameter of its columnar grain was 30 nM.

In the piezoelectric layered film 110, the first and second piezoelectric films 103 and 104 were present as aggregates of columnar grains in which two films with columnar structures were mutually continuously linked. The first piezoelectric film 103 had a thickness of 100 nm, and the cross-sectional diameter of its columnar grain was 30 nm. Also, the first piezoelectric film 103 was found to have the perovskite type crystal structure and the (001) crystal orientation ratio on the deposited face was 80%. The second piezoelectric film 104 had a thickness of 5000 nm, and the cross-sectional diameter of its columnar grain was 85 nm. The second piezoelectric film 104 was also found to have the perovskite type crystal structure and the (001) crystal orientation ratio on the deposited face was 99.5%. The ratio l/d of the thickness l of the piezoelectric layered film 110 to the cross-sectional diameter d of the columnar grain of the second piezoelectric film 104 was 60.0.

Furthermore, as a result of the composition analysis of cation through the X-ray microanalyzer, the composition ratios of Pb:Zr:Ti of the first piezoelectric film 103 and the second piezoelectric film 104 were found to be 1.15:0.51:0.49 and 1.00:0.51:0.49, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed by the same evaluation method as that employed in Example 6. When the triangle wave voltage was applied, the tip of the piezoelectric element 21 was displaced by 43.1 μm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 43.1 μm and neither film peeling nor cracks was found even after being driven a billion times.

EXAMPLE 11

In this example, a mirror finished alumina substrate (having the same shape and the same composition as that used in Example 4) was used as the substrate 101, and a first electrode film 102 prepared in the same manner as in Example 3 was used. Specifically, an iridium (Ir) thin film including 1 mol % of titanium (Ti) with a thickness of 110 nm was used as the first electrode film 102.

A buffer layer film 113 was deposited on the first electrode film 102. The buffer layer film 113 was deposited by using, as a target, a sintered body (with a diameter of 4 inches) prepared by excessively adding 10 mol % of lead oxide (PbO) to lead lanthanum manganese titanate including 10 mol % of lanthanum (La) and 3 mol % of manganese (Mn) (with a chemical composition of $(Pb_{0.87}Mn_{0.03}La_{0.10})TiO_3$). The buffer layer film 113 was deposited for 300 seconds at a substrate temperature of 540° C. in a mixed atmosphere of argon and oxygen (with a gas volume ratio of Ar:$O_2$ of 19:1) at a degree of vacuum of 0.8 Pa with high frequency power of 300 W.

Also, a piezoelectric layered film 110 was deposited by using an rf-magnetron sputtering system as in Example 3. Specifically, the piezoelectric layered film 110 was deposited by using, as a target, a sintered body with a diameter of 6 inches of PZT with a stoichiometric composition prepared by excessively adding approximately 10 mol % of PbO (having a composition molar ratio of Pb:Zr:Ti of 1.10:0.60:0.40). The piezoelectric layered film 110 was deposited under the following conditions: In a deposition chamber provided with the target, the substrate 101 having the first electrode film 102 on one face thereof was previously annealed to 550° C. and the substrate temperature was kept. A mixed gas of argon and oxygen (with a gas volume ratio of Ar:$O_2$ of 38:2) was used as the sputtering gas, the gas pressure was set to 0.25 Pa and the flow rate of the argon-oxygen gas was set to 40 ml/min. The first piezoelectric film 103 was deposited for 100 seconds with the plasma generating power set to 3 kW. Thereafter, the deposition was once stopped, the mixing ratio of Ar:$O_2$ of the sputtering gas alone was changed to 79:1 without changing the other deposition conditions, and the second piezoelectric film 104 was deposited for 2500 seconds.

The thicknesses, the chemical compositions, the film structures, the crystal structures and the crystal orientations of the first electrode film 102, the buffer layer film 113 and the first and second piezoelectric films 103 and 104 of the piezoelectric layered film 110 were examined in the same manner as in Example 1.

The first electrode film 102 was found to be made of an iridium (Ir) thin film including 1 mol % of Ti and to be an aggregate of columnar grains with a cross-sectional diameter of 20 nm.

The buffer layer film 113 was found to be a film with a columnar structure with the perovskite type crystal structure having a thickness of 100 nm, the chemical composition ratio of Pb:Mn:La:Ti of 0.90:0.03:0.10:1.00 and the (001) crystal orientation ratio of 60%, and the average diameter of its columnar grain was 70 nm.

In the piezoelectric layered film 110, the first and second piezoelectric films 103 and 104 were present as aggregates of columnar grains in which two films with columnar structures were mutually continuously linked. The first piezoelectric film 103 had a thickness of 100 nm, and the cross-sectional diameter of its columnar grain was 70 nm. Also, the first piezoelectric film 103 was found to have the perovskite type crystal structure and the (001) crystal orientation ratio on the deposited face was 80%. The second piezoelectric film 104 had a thickness of 3900 nm, and the cross-sectional diameter of its columnar grain was 200 nm. The second piezoelectric film 104 was also found to have the perovskite type crystal structure and the (001) crystal orientation ratio on the deposited face was 99.5%. The ratio l/d of the thickness l of the piezoelectric layered film 110 to the cross-sectional diameter d of the columnar grain of the second piezoelectric film 104 was 20.0.

Furthermore, as a result of the composition analysis of cation through the X-ray microanalyzer, the composition ratios of Pb:Zr:Ti of the first piezoelectric film 103 and the second piezoelectric film 104 were found to be 1.05:0.60:0.40 and 1.00:0.60:0.40, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed by the same evaluation method as that employed in Example 6. When the triangle wave voltage was applied, the tip of the piezoelectric element 21 was displaced by 46.5 µm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 46.5 µm and neither film peeling nor cracks was found even after being driven a billion times.

EXAMPLE 12

In this example, a substrate 101 and a first electrode film 102 prepared in the same manner as in Example 6 were used. Specifically, a silicon substrate was used as the substrate 101, and an iridium (Ir) thin film with a thickness of 100 nm was used as the first electrode film 102.

A buffer layer film 113 was deposited on the first electrode film 102. The buffer layer film 113 was deposited by using, as a target, a sintered body (with a diameter of 4 inches) prepared by excessively adding 10 mol % of lead oxide (PbO) to lead lanthanum strontium titanate including 12 mol % of lanthanum (La) and 3 mol % of strontium (Sr) (with a chemical composition of $(Pb_{0.85}Sr_{0.03}La_{0.12})TiO_3$). The buffer layer film 113 was deposited for 300 seconds at a substrate temperature of 520° C. in a mixed atmosphere of argon and oxygen (with a gas volume ratio of $Ar:O_2$ of 19:1) at a degree of vacuum of 0.8 Pa with high frequency power of 300 W.

Also, a piezoelectric layered film 110 was deposited in the completely same manner as in Example 6.

The thicknesses, the chemical compositions, the film structures, the crystal structures and the crystal orientations of the first electrode film 102, the buffer layer film 113 and the first and second piezoelectric films 103 and 104 of the piezoelectric layered film 110 were examined in the same manner as in Example 6.

The iridium electrode used as the first electrode film 102 was found to be an aggregate (with a thickness of 100 µm) of columnar grains with a cross-sectional diameter of 20 nm.

The buffer layer film 113 was found to be a film with a columnar structure with the perovskite type crystal structure having a thickness of 100 nm, the chemical composition ratio of Pb:La:Sr:Ti of 0.88:0.12:0.03:1.00 and the (001) crystal orientation ratio of 65%, and the average diameter of its columnar grain was 30 nm.

In the piezoelectric layered film 110, the first and second piezoelectric films 103 and 104 were present as aggregates of columnar grains in which two films with columnar structures were mutually continuously linked. The first piezoelectric film 103 had a thickness of 50 nm, and the cross-sectional diameter of its columnar grain was 30 nm. Also, the first piezoelectric film 103 was found to have the perovskite type crystal structure and the (001) crystal orientation ratio on the deposited face was 75%. The second piezoelectric film 104 had a thickness of 3850 nm, and the cross-sectional diameter of its columnar grain was 160 nm. The second piezoelectric film 104 was also found to have the perovskite type crystal structure and the (001) crystal orientation ratio on the deposited face was 99%. The ratio l/d of the thickness l of the piezoelectric layered film 110 to the cross-sectional diameter d of the columnar grain of the second piezoelectric film 104 was 24.4.

Furthermore, as a result of the composition analysis of cation through the X-ray microanalyzer, the composition ratios of Pb:Zr:Ti of the first piezoelectric film 103 and the second piezoelectric film 104 were found to be 1.15:0.53:0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed by using an evaluation apparatus similar to that used in Example 6. When the triangle wave voltage was applied, the tip of the piezoelectric element 21 was displaced by 41.2 µm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 41.2 µm and neither film peeling nor cracks was found even after being driven a billion times.

EXAMPLE 13

In this example, a substrate 101 and a first electrode film 102 prepared in the same manner as in Example 6 were used. Specifically, a silicon substrate was used as the substrate 101, and an iridium (Ir) thin film with a thickness of 100 nm was used as the first electrode film 102.

A buffer layer film 113 was deposited on the first electrode film 102. The buffer layer film 113 was deposited by using, as a target, a sintered body (with a diameter of 4 inches) of strontium titanate (with a chemical composition of $SrTiO_3$). The buffer layer film 113 was deposited for 550 seconds at a substrate temperature of 540° C. in a mixed atmosphere of argon and oxygen (with a gas volume ratio of $Ar:O_2$ of 19:1) at a degree of vacuum of 0.8 Pa with high frequency power of 300 W.

Also, a piezoelectric layered film 110 was formed in the completely same manner as in Example 6.

The thicknesses, the chemical compositions, the film structures, the crystal structures and the crystal orientations of the first electrode film 102, the buffer layer film 113 and the first and second piezoelectric films 103 and 104 of the piezoelectric layered film 110 were examined in the same manner as in Example 6.

The iridium electrode used as the first electrode film 102 was found to be an aggregate (with a thickness of 100 nm) of columnar grains with a cross-sectional diameter of 20 nm.

The buffer layer film 113 was found to be a film with a columnar structure with the perovskite type crystal structure having a thickness of 85 nm, the chemical composition ratio of Sr:Ti of 1:1 and the (001) crystal orientation ratio of 60%, and the average diameter of its columnar grain was 30 nm.

In the piezoelectric layered film 110, the first and second piezoelectric films 103 and 104 were present as aggregates of columnar grains in which two films with columnar structures were mutually continuously linked. The first piezoelectric film 103 had a thickness of 50 nm, and the cross-sectional diameter of its columnar grain was 30 nm. Also, the first piezoelectric film 103 was found to have the perovskite type crystal structure and the (001) crystal orientation ratio on the deposited face was 70%. The second piezoelectric film 104 had a thickness of 3850 nm, and the cross-sectional diameter of its columnar grain was 160 nm. The second piezoelectric film 104 was also found to have the perovskite type crystal structure and the (001) crystal orientation ratio on the deposited face was 98%. The ratio l/d of the thickness l of the piezoelectric layered film 110 to the cross-sectional diameter d of the columnar grain of the second piezoelectric film 104 was 24.4.

Furthermore, as a result of the composition analysis of cation through the X-ray microanalyzer, the composition ratios of Pb:Zr:Ti of the first piezoelectric film 103 and the second piezoelectric film 104 were found to be 1.15:0.53:0.47 and 1.10:0.53:0.47, respectively. In other words, each of the first and second piezoelectric films 103 and 104 was found to be a PZT film with the perovskite type crystal structure with the <001> axis grown preferably vertically to the top face of the substrate 101. The composition ratios of Zr and Ti were the same in the first and second piezoelectric films 103 and 104 but the composition ratio of Pb was larger in the first piezoelectric film 103 than in the second piezoelectric film 104.

The driving durability test for the piezoelectric displacement of the piezoelectric element was performed by using an evaluation apparatus similar to that used in Example 6. When the triangle wave voltage was applied, the tip of the piezoelectric element 21 was displaced by 41.6 μm at most. After the piezoelectric element 21 was driven by using the triangle wave voltage to reciprocate one hundred million times (corresponding to the driving time of 13.9 hours) or a billion times (corresponding to the driving time of 138.9 hours), the driving condition of the piezoelectric element 21 was examined and the appearance of the piezoelectric element 21 was observed with a light microscope. As a result, the piezoelectric element 21 was found to have the unchanged displacement of 41.6 μm and neither film peeling nor cracks was found even after being driven a billion times.

Comparative Example 3

In this comparative example, a piezoelectric element was fabricated in the same manner as in Example 6 except that the deposition time for the buffer layer film was changed to 900 seconds.

The buffer layer film was found to be a film with a columnar structure with the perovskite type crystal structure having a thickness of 300 nm, the chemical composition ratio of Pb:La:Ti of 0.90:0.14:1.00 and the (001) crystal orientation ratio of 80%, and the average diameter of its columnar grain was 50 nm.

In the piezoelectric layered film, the first and second piezoelectric films were present as aggregates of columnar grains in which two films with columnar structures were mutually continuously linked. The first piezoelectric film had a thickness of 50 nm, and the cross-sectional diameter of its columnar grain was 50 nm. Also, the first piezoelectric film was found to have the perovskite type crystal structure and the (001) crystal orientation ratio on the deposited face was 80%. The second piezoelectric film had a thickness of 3850 nm, and the cross-sectional diameter of its columnar grain was 180 nm. The second piezoelectric film was also found to have the perovskite type crystal structure and the (001) crystal orientation ratio on the deposited face was 100%. The ratio l/d of the thickness l of the piezoelectric layered film to the cross-sectional diameter d of the columnar grain of the second piezoelectric film was 21.7.

Furthermore, as a result of the composition analysis of cation through the X-ray microanalyzer, the composition ratios of Pb:Zr:Ti of the first piezoelectric film and the second piezoelectric film were found to be 1.15:0.53:0.47 and 1.10:0.53:0.47, respectively. In other words, each of the first and second piezoelectric films was found to be a PZT film with the perovskite type crystal structure with the <001> axis grown preferably vertically to the top face of the substrate. The composition ratios of Zr and Ti were the same in the first and second piezoelectric films but the composition ratio of Pb was larger in the first piezoelectric film than in the second piezoelectric film.

The driving durability test for the piezoelectric displacement of the piezoelectric element was performed by the same evaluation method as that employed in Example 6. When the triangle wave voltage was applied, the tip of the piezoelectric element was displaced by 40.5 μm at most. After the piezoelectric element was driven by using the triangle wave voltage to reciprocate one hundred million times (corresponding to the driving time of 13.9 hours) or a billion times (corresponding to the driving time of 138.9 hours), the driving condition of the piezoelectric element was examined and the appearance of the piezoelectric element was observed with a light microscope. As a result, the displacement of the piezoelectric element was found to be lowered to 34.0 μm and film peeling was slightly caused in a peripheral portion after being driven one hundred million times. After driving it a billion times, the displacement was no longer caused and a large number of film peeling and cracks were found.

Effects

As described above, according to this embodiment, since the buffer layer film 13 is disposed between the first electrode film 2 and the first piezoelectric film 3, the adhesion between the first electrode film 2 and the first piezoelectric film 3 is improved. Therefore, even when a high voltage is applied, no film peeling is caused between the first electrode film 2 and the first piezoelectric film 3. Accordingly, the piezoelectric element 21 can attain high piezoelectric properties and is free from degradation.

Furthermore, the first electrode film 2 activates the function of the buffer layer film 13 as the crystal orientation controlling film. Also, the buffer layer film 13 activates the function of the first piezoelectric film 3 as the crystal orientation controlling film. Accordingly, the first piezoelectric film 3 can definitely control the crystal orientation of the second piezoelectric film 4.

Embodiment 3

In this embodiment, the piezoelectric element according to the invention is applied to an inkjet head.

Figure 8:
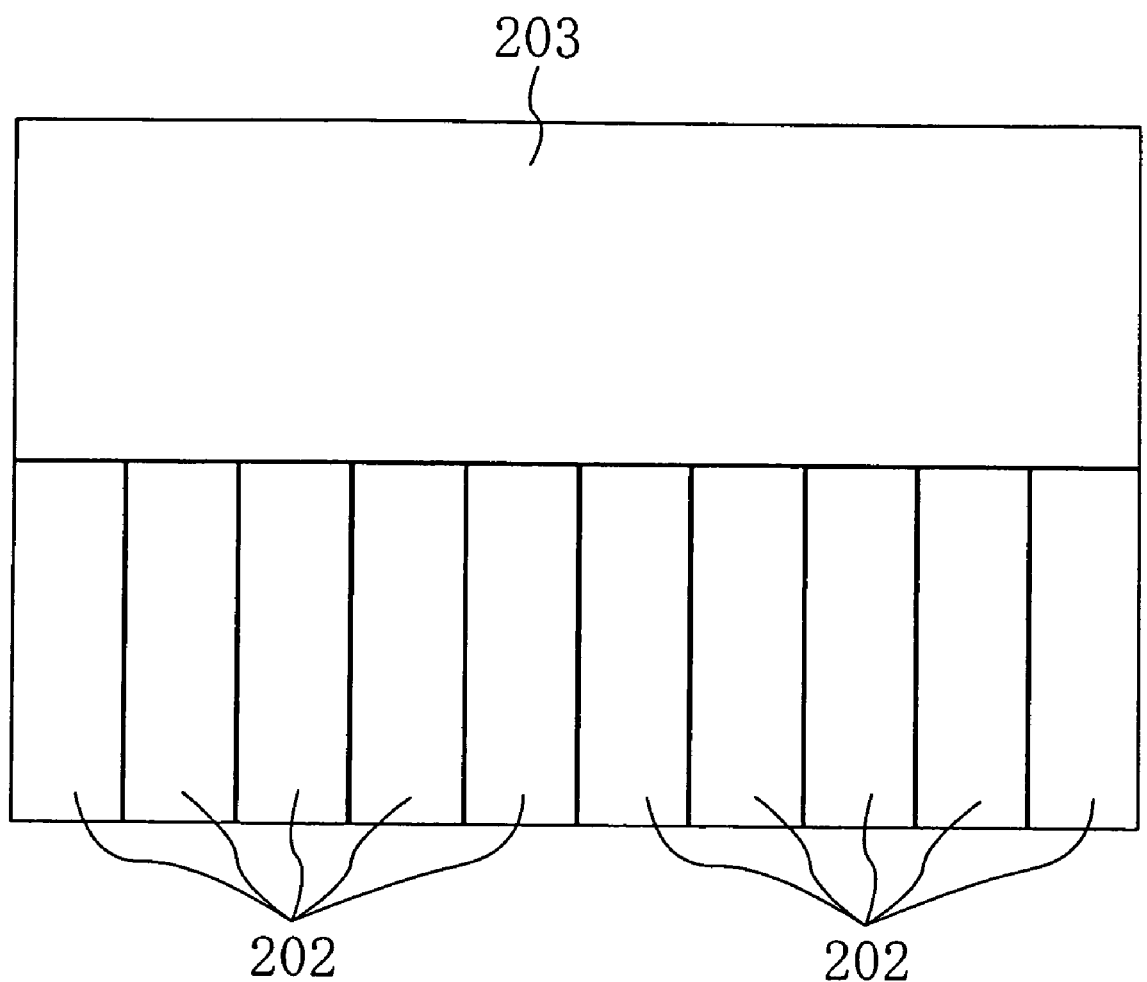
FIG. 8 is a schematic diagram for showing the structure of an inkjet head.

As shown in FIG. 8, an inkjet head 201 of this embodiment includes linearly arranged ten ink discharging devices 202 all in the same shape and a driving power device 203 connected to individual electrodes 33 (see FIG. 9) of the respective ink discharging devices 202 for driving the ink discharging devices 202.

Figure 9:
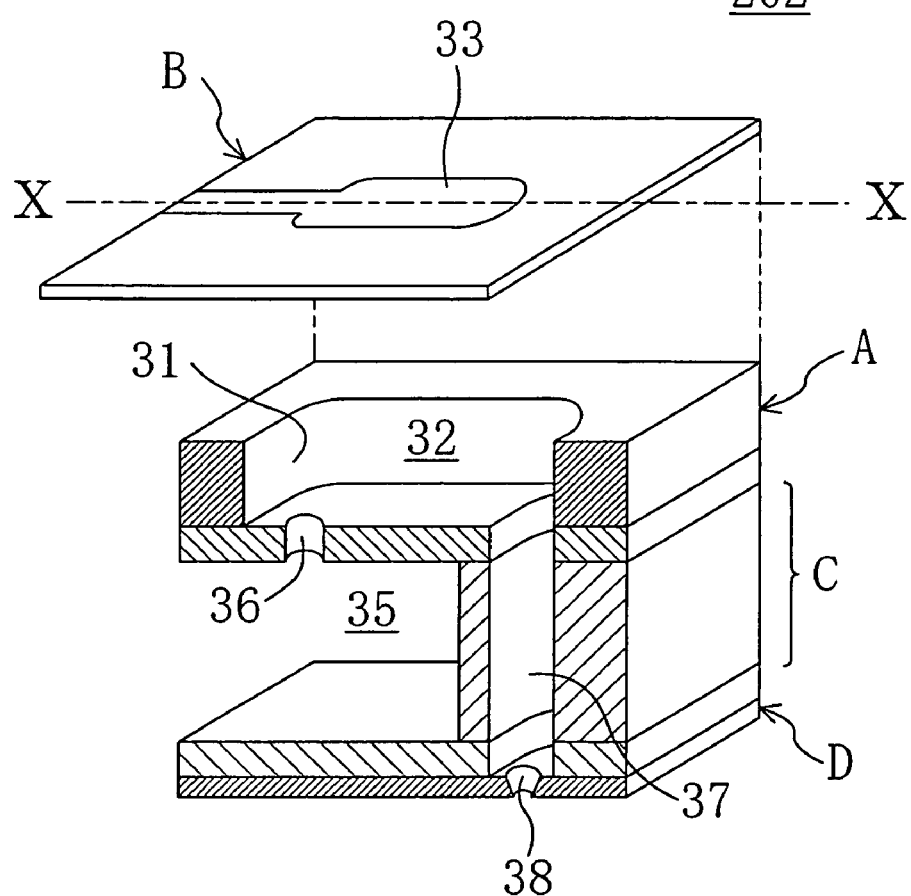
FIG. 9 is an exploded perspective view in which a part of an ink discharging device is cut out.

As shown in FIG. 9, each ink discharging device 202 includes a nozzle plate D, an ink passage component C and a pressure chamber component A and an actuator component B stacked in this order. The nozzle plate D, the ink passage component C and the pressure chamber component A are fixedly adhered to one another with an adhesive. The pressure chamber component A has a pressure chamber opening 31. An actuator component B is provided so as to cover the upper opening face of the pressure chamber opening 31. In other words, the actuator component B is provided with a part of its face corresponding to one end thereof along the thickness direction facing the pressure chamber opening 31. The upper opening face of the pressure chamber opening 31 has an elliptical shape with a minor axis of 200 µm and a major axis of 400 µm. The actuator component B is disposed above a pressure chamber 32. The ink passage component C is provided so as to cover the lower opening face of the pressure chamber opening 31. In other words, the pressure chamber opening 31 of the pressure chamber component A is partitioned by the actuator component B and the ink passage component C respectively provided on and below the pressure chamber component A, and the partitioned space corresponds to the pressure chamber 32 (with a thickness of 0.2 mm) for containing an ink. The ink passage component C has a common ink chamber 35 shared by a plurality of pressure chambers 32 arranged along a given direction (for example, along an ink supplying direction), a supply port 36 for communicating the common ink chamber 35 with each pressure chamber 32, and an ink passage 37 for communicating each pressure chamber 32 with a nozzle hole 38 described below. The nozzle plate D has the nozzle hole 38 with a diameter of 30 µm. The driving power device 203 supplies a voltage to the individual electrodes 33 of the respective ink discharging devices 202 through bonding wires. It is noted that a head body of this invention corresponds to a combination of the nozzle plate D, the ink passage component C and the pressure chamber component A, and a piezoelectric element of the invention corresponds to the actuator component B. Now, the structure of the actuator component B will be described in detail.

EXAMPLE 14

Figure 10:
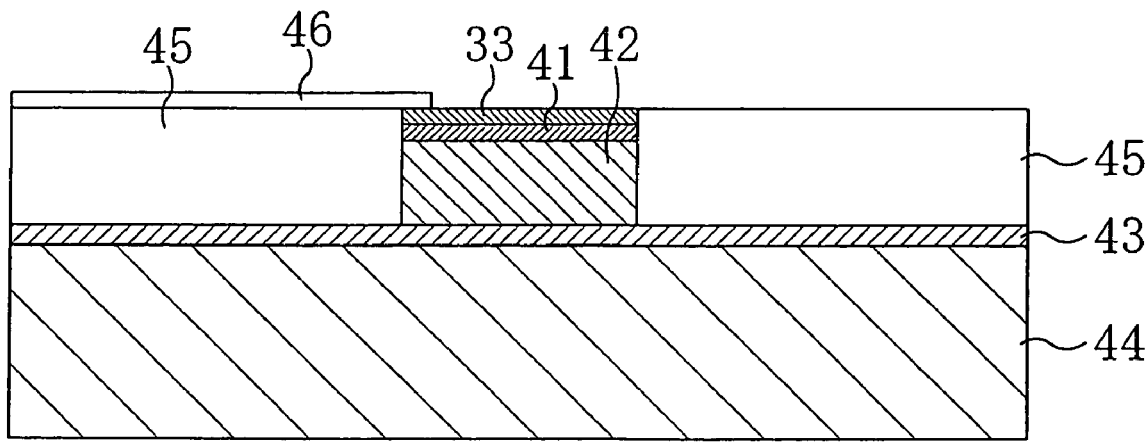
FIG. 10 is a cross-sectional view taken on line X—X of FIG. 9.

FIG. 10 is a cross-sectional view of an actuator component B of this example. The actuator component B includes an individual electrode 33 made of an iridium (Ir) film including 4 mol % of cobalt (Co) with a thickness of 240 nm, a first piezoelectric film 41 with a thickness of 80 nm provided directly below the individual electrode 33 and made of PZT represented by $Pb_{1.15}Zr_{0.53}Ti_{0.47}O_3$, a second piezoelectric film 42 with a thickness of 4500 nm provided directly below the first piezoelectric film 41 and made of PZT represented by $Pb_{1.05}Zr_{0.53}Ti_{0.47}O_3$, a second electrode film (common electrode) 43 with a thickness of 100 nm provided directly below the second piezoelectric film 42 and made of platinum, and a diaphragm film 44 with a thickness of 3500 nm provided directly below the second electrode film 43 and made of chromium (Cr). The individual electrode 33 is provided correspondingly to and in a position corresponding to each pressure chamber 32. The diaphragm film 44 is displaced to vibrate owing to the piezoelectric effect obtained by the piezoelectric films 41 and 42. The second electrode film 43 and the diaphragm film 44 are shared by the respective ink discharging devices 202. On the second electrode film 43, an electric insulating organic film 45 of polyimide resin is formed up to the same height as the top face of the individual electrode 33 in a portion excluding the portion where a layered film of the individual electrode 33, the first piezoelectric film 41 and the second piezoelectric film 42 is formed. A leading electrode 46 made of gold with a thickness of 100 nm in the shape of a lead and connected to the individual electrode 33 is formed on the top face of the electric insulating organic film 45.

(Fabrication Method for Actuator Component)

Figure 11A:
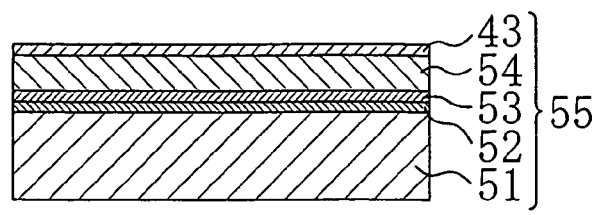
FIGS. 11A, 11B, 11C, 11D and 11E are diagrams for showing procedures for fabricating an actuator component.
Figure 11B:
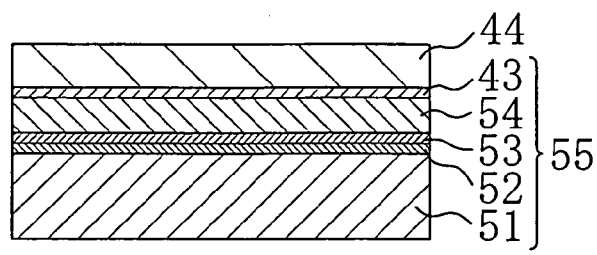
Figure 11C:
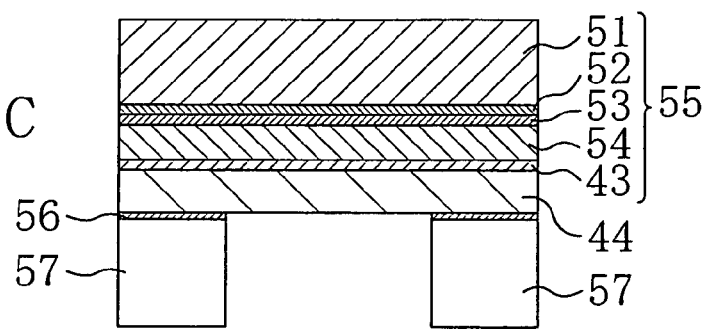
Figure 11D:
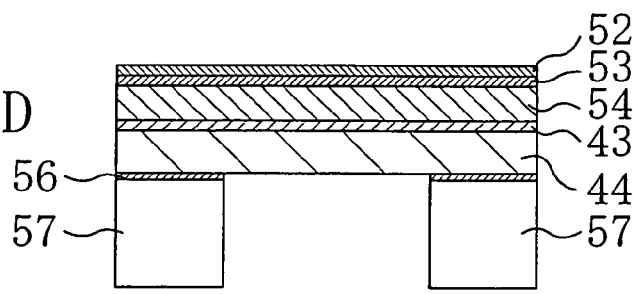

Now, a method for fabricating the actuator component B will be described with reference to FIGS. 11A through 11E and 12A through 12D. In the same manner as in Example 5, a first electrode film 52, a first piezoelectric film 53, a second piezoelectric film 54 and a second electrode film 43 were stacked in this order on a silicon substrate 50 with a length of 20 mm, a width of 20 mm and a thickness of 0.3 mm, so as to obtain a structure 55 shown in FIG. 11A. Next, a diaphragm film 44 was deposited on the second electrode film 43 of the structure 55 by the rf-magnetron sputtering at room temperature (as shown in FIG. 11B). Then, the structure 55 having the diaphragm film 44 on one face thereof was adhered onto a pressure chamber component 57 of glass with the diaphragm film 44 and an adhesive (an acrylic resin) 56 sandwiched therebetween as shown in FIG. 11c.

Figure 11E:
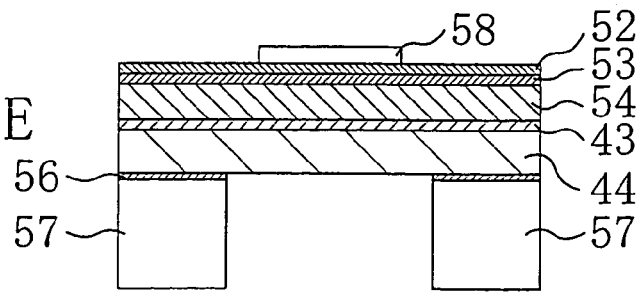
Figure 12A:
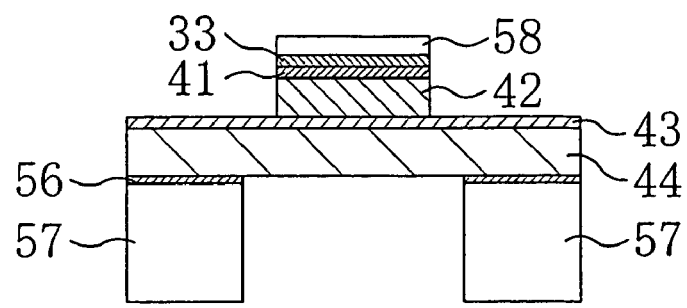
FIGS. 12A, 12B, 12C and 12D are diagrams for showing other procedures for fabricating the actuator component.
Figure 12B:
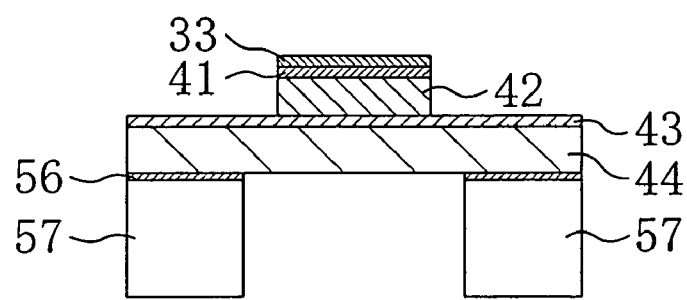
Figure 12C:
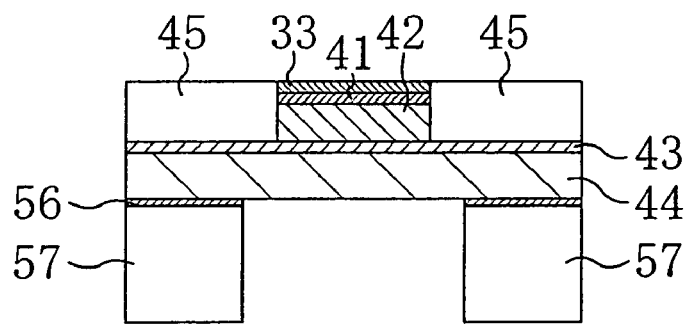
Figure 12D:
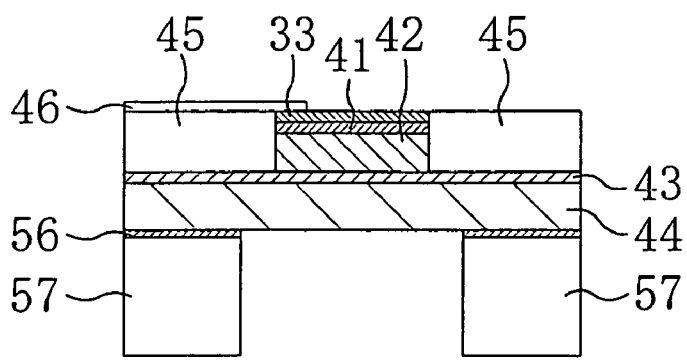

Next, the silicon substrate 51 was removed by dry etching using $SF_6$ gas by using a plasma reactive etching apparatus (as shown in FIG. 1D). Thereafter, as shown in FIG 11E, an etching target portion of the layered film of the first electrode film 52, the first piezoelectric film 53 and the second piezoelectric film 54 was accurately patterned by using a photoresist resin film 58 into an elliptical pattern (specifically, having a minor axis of 180 µm and a major axis of 380 µm). Then, the resultant was subjected to dry etching by Ar gas and wet etching by dilute hydrofluoric acid, so as to individually divide the layered film of the first electrode film 52, the first piezoelectric film 53 and the second piezoelectric film 54 as a photoresist pattern. Thus, an actuator structure (as shown in FIG. 12A) composed of the layered film of an individual electrode 33, a first piezoelectric film 41 and a second piezoelectric film 42 was obtained. Thereafter, the photoresist resin film 58 was removed by using a resist repellent (as shown in FIG. 12B). Next, as shown in FIG. 12C, in a portion on the second electrode film 43 excluding the portion where the layered film was formed, an electric insulating organic film 45 was formed by a printing method. Then, a leading electrode film 46 was formed on the electric insulating organic film 45 by DC sputtering (as shown in FIG. 12D). In this manner, the actuator component B shown in FIG. 10 was fabricated.

The inkjet head 201 of FIG. 8 was fabricated by using ten ink discharging devices 202 fabricated in the aforementioned manner.

(Operation of Inkjet Head)

Now, the operation of the inkjet head 201 will be described.

First, a voltage is applied by the driving power device 20 through the bonding wires to the respective individual electrodes 33 of the ten ink discharging devices 202. Thus, the diaphragm film 44 is displaced to vibrate owing to the piezoelectric effect of the piezoelectric films 41 and 42. Accordingly, the ink contained in the common ink chamber 35 is discharged from the nozzle hole 38 through the supply port 36, the pressure chamber 32 and the ink passage 37.

At this point, in the inkjet head 201, both the piezoelectric films 41 and 42 included in the actuator component B have the crystal orientation along the (001) plane. Also, both the piezoelectric films 41 and 42 have high piezoelectric displacement properties. Therefore, large piezoelectric displacement can be attained by the inkjet head 201.

Furthermore, since the adhesion between the first electrode film 52 and the first piezoelectric film 53 is high, a failure derived from film peeling is minimally caused even when a high voltage is applied to cause large displacement. As a result, the inkjet head 201 can be stably driven with high reliability.

Also, since the piezoelectric displacement of the ink discharging device 202 is large, namely, the ink discharging ability of the ink discharging device 202 is high, a margin can be provided in adjustment of the power voltage. Therefore, the plural ink discharging devices 202 can be easily controlled to minimize the variation in discharging the ink.

EXAMPLE 15

An inkjet head of this example has the same structure as that of Example 14 except that a buffer film layer is disposed between the individual electrode 33 and the first piezoelectric film 41 in the actuator component B. The buffer layer film is, similarly to that of Example 6, a thin film of lead lanthanum titanate with the perovskite type crystal structure having a thickness of 100 nm, the chemical composition ratio of Pb:La:Ti of 0.90:0.14:1.00 and the (001) crystal orientation ratio of 50%.

The fabrication method for this actuator component B is different from that of Example 14 in forming the buffer layer film between the first electrode film 52 and the first piezoelectric film 53. This buffer layer film is deposited in the same manner as in Example 6. The inkjet head 201 of this example is fabricated in the same manner as in Example 14 by using the actuator component B thus fabricated.

In this inkjet head 201, both the piezoelectric films 41 and 42 included in the actuator component B have the crystal orientation along the (001) plane. Also, both the piezoelectric films 41 and 42 have high piezoelectric displacement properties. Therefore, large piezoelectric displacement can be attained by this inkjet head 201.

Furthermore, since the buffer layer film is disposed between the first electrode film 52 and the first piezoelectric film 53, the adhesion between the first electrode film 52 and the first piezoelectric film 53 is improved. Therefore, a failure derived from film peeling is minimally caused even when a high voltage is applied to cause large displacement. As a result, the inkjet head 201 can be stably driven with high reliability.

Also, since the piezoelectric displacement of the ink discharging device 202 is large, namely, the ink discharging ability of the ink discharging device 202 is high, margin can be provided in adjustment of the power voltage. Therefore, the plural ink discharging devices 202 can be easily controlled to minimize the variation in discharging the ink.

Effect

As described above, according to this embodiment, in the inkjet head 201 including a plurality of ink discharging devices 202, the variation in discharging the ink among the ink discharging devices 202 can be minimized. Therefore, the inkjet head 201 can attain high properties. The actuator component B with high properties can be fabricated by using any materials for forming the first electrode film 52, the first piezoelectric film 53, the second piezoelectric film 54 and the second electrode film 43 of the actuator component B as far as they are materials used in the piezoelectric element of Embodiment 1.

Although the diaphragm film 44 of this embodiment is made of chromium, the material for the diaphragm film 44 is not limited to chromium but may be any of silicon, glass, a ceramic material and a metal material apart from chromium.

Although the diaphragm film 44 is formed on the face of the second electrode film 43 opposite to the second piezoelectric film 42 in this embodiment, the diaphragm film 44 may be formed on the face of the individual electrode 33 opposite to the first piezoelectric film 41.

Embodiment 4

In this embodiment, the piezoelectric element according to this invention is applied to an inkjet recording apparatus. Now, specifically practiced examples will be described.

EXAMPLE 16

Figure 13:
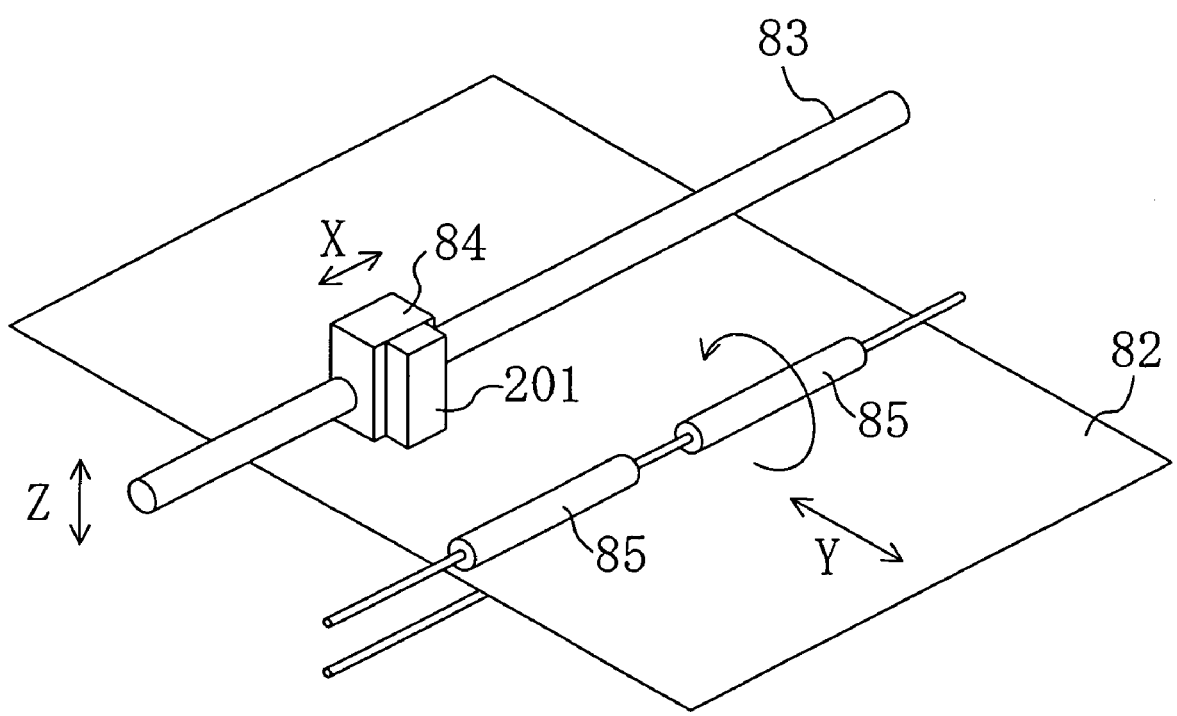
FIG. 13 is a schematic perspective view of a serial inkjet recording apparatus.

As shown in FIG. 13, a serial inkjet recording apparatus 81 of this example includes the inkjet head 201 (described in Embodiment 3) for performing a recording operation by using the piezoelectric effect of the piezoelectric films 41 and 42, so that data can be recorded on a recording medium 82 such as paper by adhering ink drops discharged from the inkjet head 201 onto the recording medium 82. The inkjet head 201 is loaded on a carriage 84 movably provided on a carriage axis 83 disposed along a primary scanning direction (that is, the X-direction in FIG. 13). The carriage 84 is reciprocated along the carriage axis 83 so that the inkjet head 201 can be reciprocated along the primary scanning direction X. The inkjet recording apparatus 81 further includes a plurality of rollers 85 for moving the recording medium 82 along a secondary scanning direction Y substantially perpendicular to the width direction of the inkjet head 201 (namely, the primary scanning direction X). Moving means of this invention corresponds to the carriage axis 83, the carriage 84 and the rollers 85.

Effect

As described above, the line inkjet recording apparatus 81 of this example includes the inkjet head 201 (according to Embodiment 3) capable of easily controlling the variation in discharging the ink among the plural ink discharging devices 202. Therefore, unevenness in printing can be reduced in the recording operation. Accordingly, the serial inkjet recording apparatus 81 can attain high reliability.

EXAMPLE 17

Figure 14:
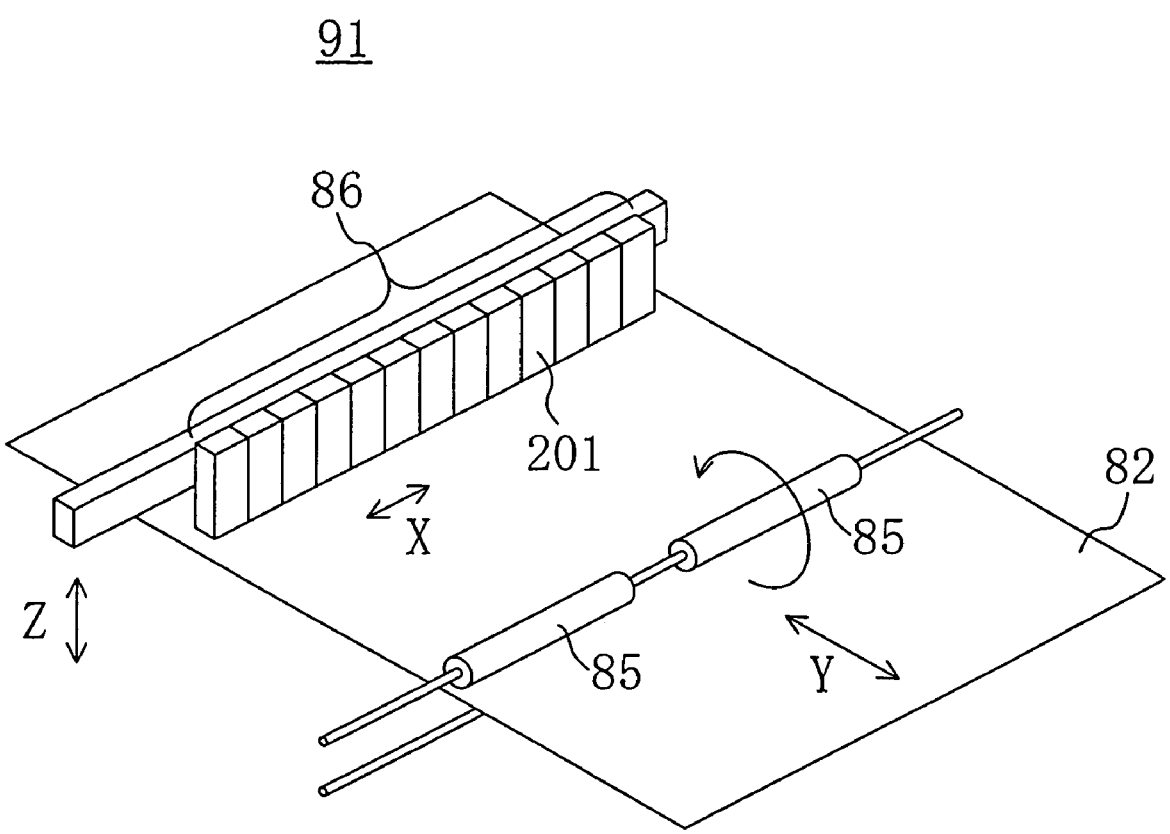
FIG. 14 is a schematic perspective view of a line inkjet recording apparatus.

As shown in FIG. 14, a line inkjet recording apparatus 91 of this example includes a line-shaped block 86 composed of thirteen inkjet heads 201 (described in Embodiment 3) for performing a recording operation by using the piezoelectric effect of the piezoelectric films 41 and 42, so that data can be recorded on a recording medium 82 such as paper by adhering ink drops discharged from the inkjet heads 201 onto the recording medium 82. The inkjet recording apparatus 91 further includes a plurality of rollers 85 for moving the recording medium 82 along a secondary scanning direction Y. The moving means of this invention corresponds to the rollers 85.

Effect

As described above, the line inkjet recording apparatus 91 of this example includes the inkjet head 201 (according to Embodiment 3) capable of easily controlling the variation in discharging the ink among the plural ink discharging devices 202. Therefore, the recording operation can be rapidly performed on a wide recording medium 82 and unevenness in printing can be reduced in the recording operation. Accordingly, the line inkjet recording apparatus 91 can attain high reliability.

Embodiment 5

Figure 15:
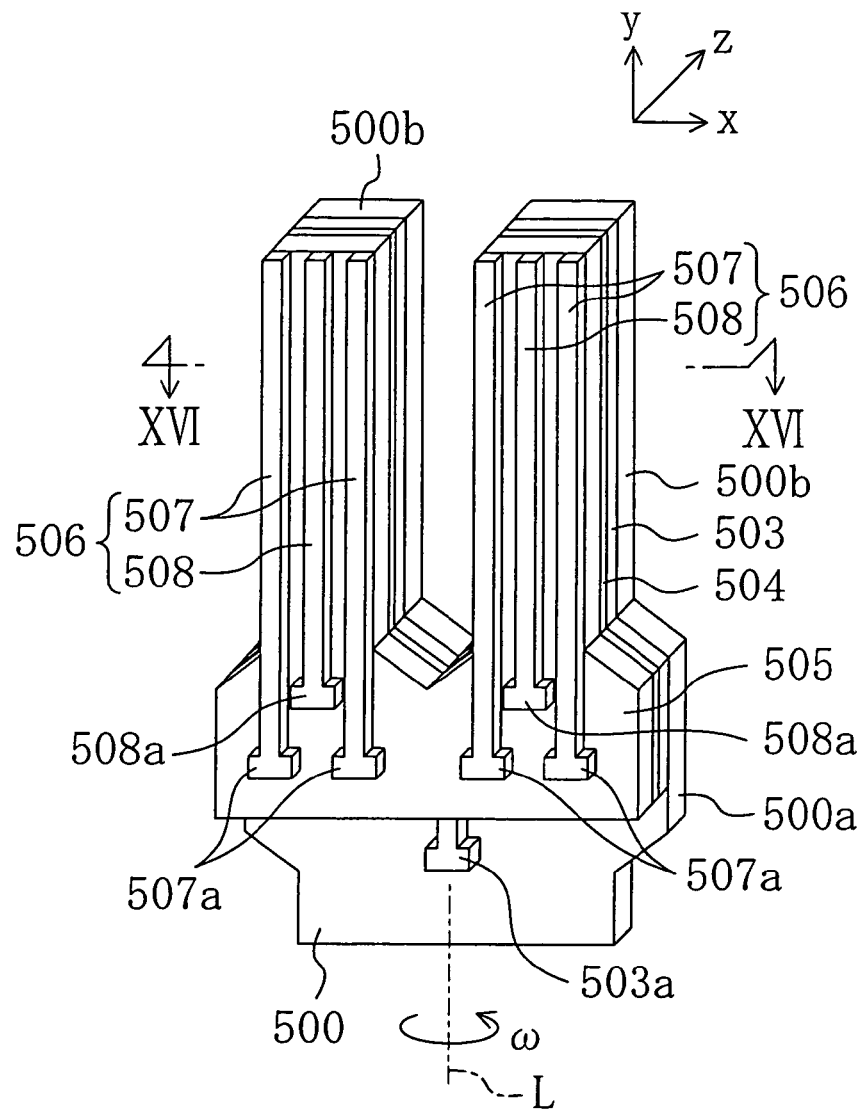
FIG. 15 is a schematic perspective view of an angular velocity sensor.
Figure 16:
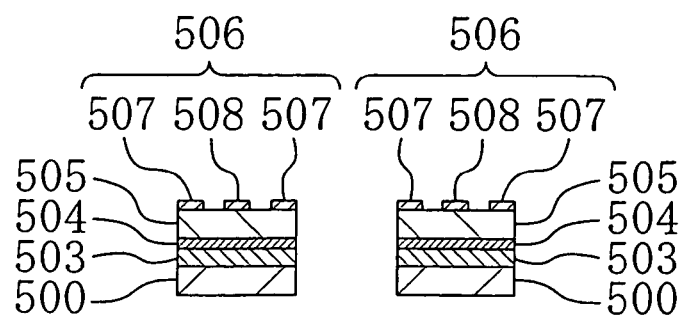
FIG. 16 is a cross-sectional view taken on line XVI—XVI of FIG. 15.

FIGS. 15 and 16 shows an angular velocity sensor according to Embodiment 5 of the invention. This angular velocity sensor is a fork type angular velocity sensor and is suitably used in a navigation system or the like installed on a vehicle.

The angular velocity sensor includes a substrate 500 made of a silicon wafer with a thickness of 0.3 mm. The substrate 500 includes a fixed part 500a and a pair of vibrating parts 500b extending from the fixed part 500a along a given direction (corresponding to a direction of the rotation center axis of an angular velocity to be detected; corresponding to the Y direction in FIG. 15). The fixed part 500a and the pair of vibrating parts 500b are in the shape of a tuning fork when seen from the thickness direction of the substrate 500 (that is, the Z direction in FIG. 15). The pair of vibrating parts 500b correspond to the prongs of a tuning fork and are arranged along the width direction of the vibrating parts 500b to extend in parallel to each other. The substrate 500 may be a glass substrate.

On each vibrating part 500b and a portion of the fixed part 500a close to the vibrating parts 500b on the substrate 500, a first electrode film 503, a piezoelectric layered film 510 composed of a first piezoelectric film 504 and a second piezoelectric film 505, and a second electrode film 506 are stacked in this order. The materials and the thicknesses of the first electrode film 503, the first piezoelectric film 504, the second piezoelectric film 505 and the second electrode film 506 are the same as those of the first electrode film 2, the first piezoelectric film 3, the second piezoelectric film 4 and the second electrode film 5 described in Embodiment 1.

The second electrode film 506 is formed, on each vibrating part 500b, in patterns of two driving electrodes 507 for vibrating the vibrating part 500b along the width direction thereof (corresponding to the X direction in FIG. 15) and one detecting electrode 508 for detecting deformation (deflection) along the thickness direction (corresponding to the Z direction) of the vibrating part 500b.

The two driving electrodes 507 are provided in the respective edge portions along the width of each vibrating part 500b (corresponding to the X direction) over the whole length thereof (along the Y direction), and each of the driving electrodes 507 has, on the fixed portion 500a, a connection terminal 507a at the end thereof close to the fixed part 500a. It is noted that merely one driving electrode 507 may be provided one edge portion along the width of each vibrating part 500b.

On the other hand, the detecting electrode 508 is provided at the center of the width direction of each vibrating part 500b over the whole length of the vibrating part 500b, and has, on the fixed part 500a, a connection terminal 508a at the end thereof close to the fixed part 500a similarly to the driving electrodes 507. It is noted that a plurality of detecting electrodes 508 may be provided on each vibrating part 500b.

The first electrode film 503 has, on the fixed part 500a, a connection terminal 503a protruding to the opposite side to the vibrating parts 500b at the center between the pair of vibrating parts 500b.

A voltage with a frequency resonating with the natural vibration of the vibrating parts 500b is applied between the first electrode film 503 and the two driving electrodes 507 on each vibrating part 500b, so as to vibrate the vibrating parts 500b in their width direction. Specifically, a ground voltage is applied to the first electrode film 503 and negative and positive voltages are respectively applied to the two driving electrodes 507. Therefore, when one edge portion along the width of each vibrating part 500b expands, the other edge portion contracts, and hence, the vibrating part 500b is deformed toward the latter edge portion. On the other hand, when one edge portion along the width of each vibrating part 500b contracts, the other edge portion expands, and hence, the vibrating part 500b is deformed toward the former edge portion. By alternately repeating these operations, the vibrating part 500b vibrates along the width direction. It is noted that the vibrating part 500b can be vibrated along the width direction by applying a voltage to merely one of the two driving electrodes 507 on the vibrating part 500b. The pair of vibrating parts 500b are deformed toward the opposite directions along their width direction, so as to vibrate symmetrically with respect to a center line L extending at the center of the pair of vibrating parts 500b along the longitudinal direction of the vibrating parts 500b.

In the angular velocity sensor having the aforementioned structure, when the pair of vibrating parts 500b are vibrated along their width direction (corresponding to the X direction) symmetrically with respect to the center line L, if an angular velocity ω is applied around the center line L, the two vibrating parts 500b are deflected and deformed along their thickness direction (corresponding to the Z direction) (to the opposite directions to each other by the same amount) owing to the Coriolis force. Therefore, the piezoelectric layered film 510 is also deflected, and hence, a voltage according to the amplitude of the Coriolis force is generated between the first electrode film 503 and the detecting electrode 508. The angular velocity ω can be detected on the basis of the amplitude of this voltage (the Coriolis force). Specifically, the Coriolis force Fc is represented by using the velocity v along the width direction of each vibrating part 500b and the mass m of each vibrating part 500b as follows:

$$Fc = 2mv\omega$$

Accordingly, the value of the angular velocity ω can be found on the basis of the Coriolis force Fc.

Figure 17A:
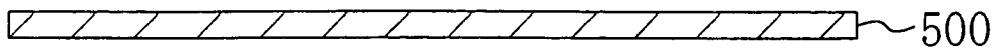
FIGS. 17A, 17B, 17C, 17D, 17E and 17F are diagrams for showing procedures for fabricating the angular velocity sensor.
Figure 17B:
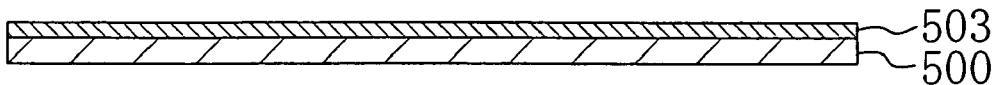
Figure 17C:
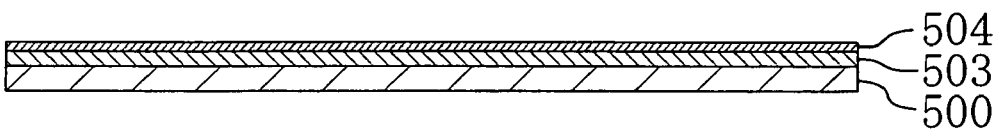
Figure 17D:
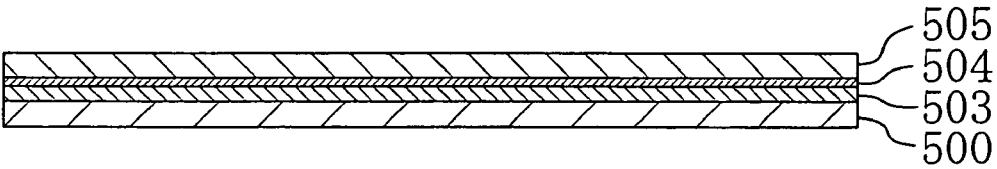
Figure 17E:
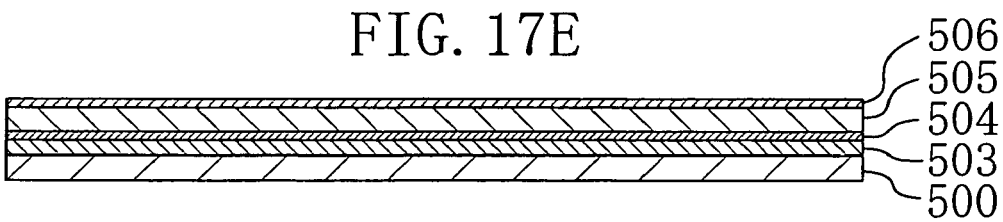

Next, a method for fabricating the angular velocity sensor will be described with reference to FIGS. 17A through 17F and 18. As shown in FIG. 17A, a substrate 500 of a silicon wafer with a thickness of 0.3 mm and a diameter of 4 inches (whose plan view is shown in FIG. 18) having its (001) plane polished was prepared. As shown in FIG. 17B through 17E, a first electrode film 503, a first piezoelectric film 504, a second piezoelectric film 505 and a second electrode film 506 were deposited on this substrate 500 by using a ternary rf-magnetron sputtering system. These films were deposited under the same conditions as those employed in Example 1. Also, the crystal structures, the crystal orientations and the compositions of the respective piezoelectric films 504 and 505 were the same as those described in Example 1.

Figure 17F:
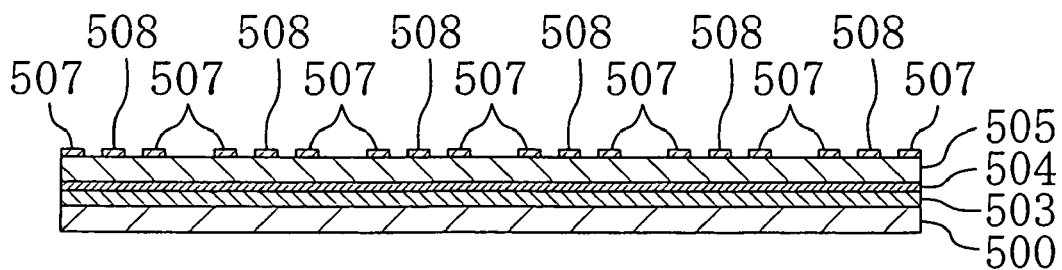
Figure 18:
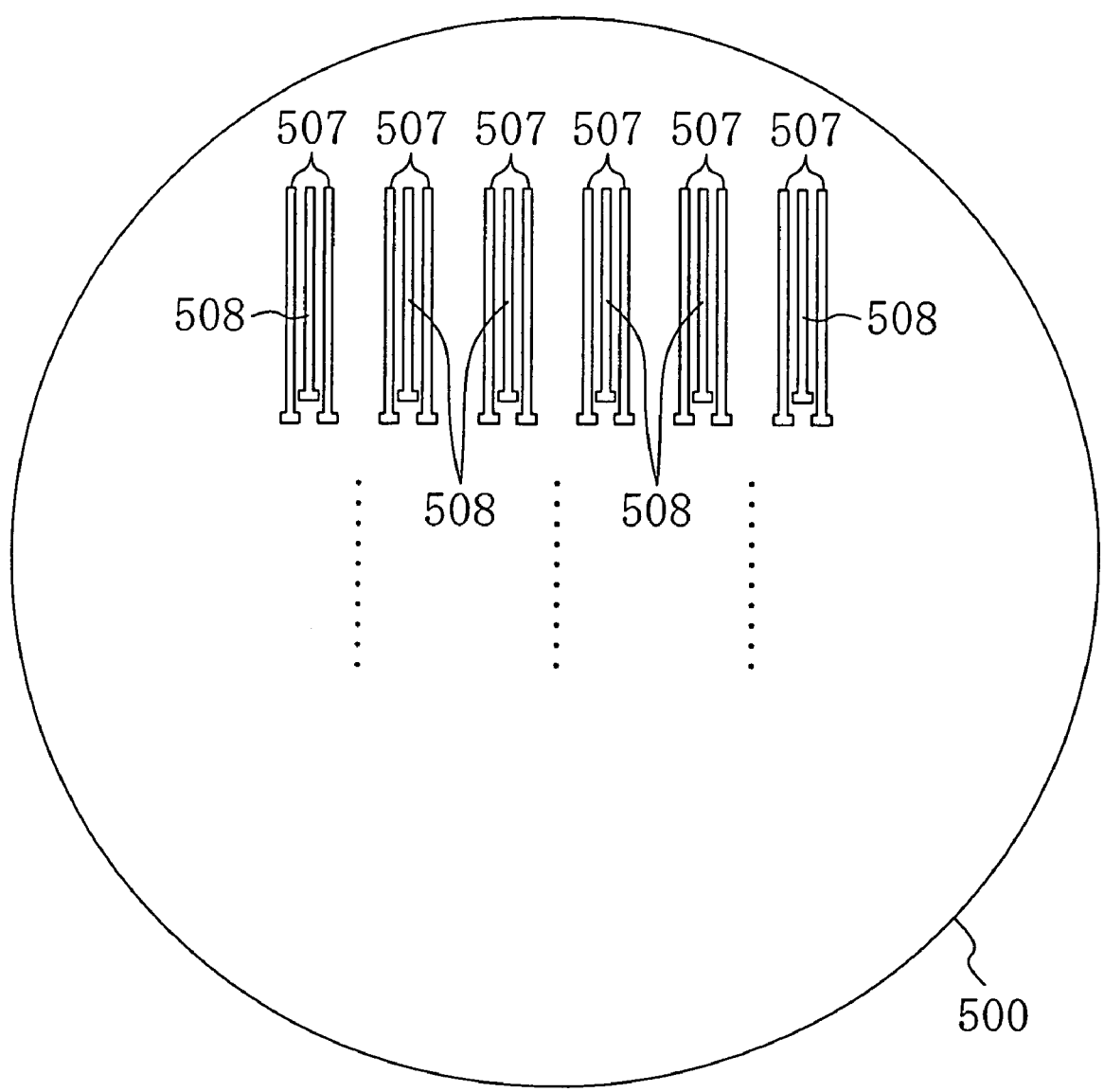
FIG. 18 is a plan view of a second electrode film patterned in the fabrication of the angular velocity sensor.

Next, as shown in FIG. 17F, the second electrode film 506 was patterned into driving electrodes 507 and detecting electrodes 508. Specifically, a photosensitive resin was applied on the second electrode film 506, and patterns of the driving electrodes 507 and the detecting electrodes 508 were exposed on the photosensitive resin. Thereafter, an unexposed portion of the photosensitive resin was removed through development, a portion of the second electrode film 506 disposed in the position where the photosensitive resin had been removed was removed by etching, and then, the photosensitive resin remaining on the driving electrodes 507 and the detecting electrodes 508 was removed.

After patterning the second electrode film 506, the application and the exposure of the photosensitive resin were repeated, so as to pattern the piezoelectric layered film 510, the first electrode film 503 and the silicon substrate 500, thereby forming a fixed part 500a and vibrating parts 500b. Thus, the aforementioned angular velocity sensor was completed. It is noted that the substrate 500 may be a glass substrate instead of the silicon substrate.

Now, a conventional angular velocity sensor will be described with reference to FIGS. 19 and 20.

Figure 19:
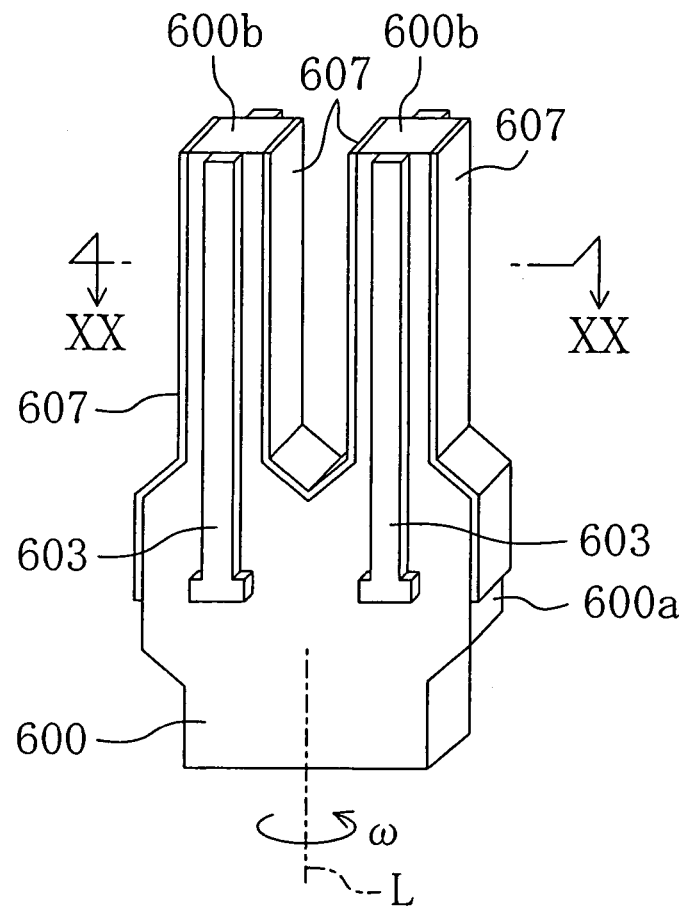
FIG. 19 is a schematic perspective view of a conventional angular velocity sensor using quartz.
Figure 20:
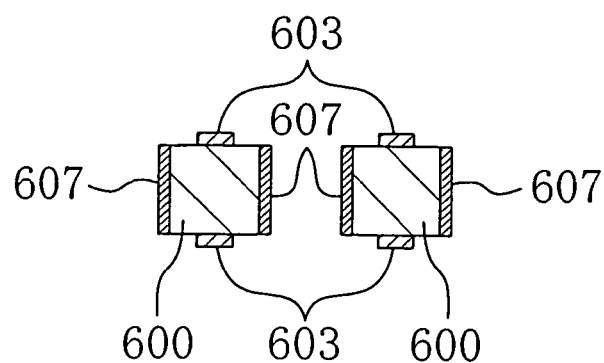
FIG. 20 is a cross-sectional view taken on line XX—XX of FIG. 19.

This conventional angular velocity sensor includes a piezoelectric body 600 of quartz with a thickness of 0.3 mm, and the piezoelectric body 600 includes, similarly to the substrate 500 of the angular velocity sensor of this embodiment, a fixed part 600a and a pair of vibrating parts 600b extending in parallel to each other from the fixed part 600a toward one side of the fixed part 600a (corresponding to the Y direction in FIG. 19). On each of the faces of the vibrating parts 600b opposing each other along the thickness direction (corresponding to the Z direction in FIG. 19), one driving electrode 603 for vibrating the vibrating part 600b along the width direction (corresponding to the X direction in FIG. 19) is provided, and on each of the side faces of each vibrating part 600b, one detecting electrode 607 for detecting deformation along the thickness direction of the vibrating part 600b is provided.

In the conventional angular velocity sensor, a voltage with a frequency resonating with the natural vibration of the vibrating parts 600b is applied between the two driving electrodes 603 on each vibrating part 600b, so as to vibrate the pair of vibrating parts 600b along their width direction (corresponding to the X direction of FIG. 19) symmetrically with respect to a center line L extending at the center of the pair of vibrating parts 600b in the same manner as in the angular velocity sensor of this embodiment. At this point, when an angular velocity ω is applied around the center line L, the pair of vibrating parts 600b are deflected and deformed along the thickness direction (corresponding to the Z direction in FIG. 19) owing to the Colioris force. Therefore, a voltage according to the amplitude of the Colioris force is generated between the two detecting electrodes 607 on each vibrating part 600, and hence, the angular velocity ω can be detected on the basis of the amplitude of the voltage (the Colioris force).

Since the conventional angular velocity sensor uses the piezoelectric body 600 of quarts, the piezoelectric constant is as low as −3 pico m/V. In addition, since the fixed part 600a and the vibrating parts 600b are fabricated through mechanical processing, it is difficult to reduce these parts and the dimensional accuracy is disadvantageously low.

In contrast, in the angular velocity sensor of this embodiment, the part for detecting the angular velocity (i.e., the vibrating part 500b) is constructed by using the piezoelectric element having the same structure as that described in Embodiment 1. Therefore, the piezoelectric constant can be increased by approximately 40 times as compared with that of the conventional angular velocity sensor, and the angular velocity sensor can be largely downsized. Also, since refining processing using technique to deposit thin films can be employed for fabricating the angular velocity sensor of this embodiment, the dimensional accuracy can be remarkably improved.

Although the substrate 500 includes merely one pair of vibrating parts 500b in the angular velocity sensor of this embodiment, a plurality of pairs of vibrating parts may be provided so as to detect angular velocities around a plurality of axes extending various directions.

Furthermore, in the angular velocity sensor of this embodiment, a buffer layer film used in the examples of Embodiment 2 may be provided between the first electrode film 503 and the first piezoelectric film 504 as in the film structure of the piezoelectric element of Embodiment 2. Also in this case, angular velocity sensors with high resistance to high voltage and high reliability can be fabricated with high reproducibility of properties even through industrial mass-production.

As described so far, the present invention is useful for not only an inkjet head and an angular velocity sensor but also a gyrostabilizer, a vibration sensor and the like. Also, the present invention is applicable to a micro machine device or the like.

What is claimed is:

1. A piezoelectric element comprising:
   a first electrode film;
   a piezoelectric layered film composed of a first piezoelectric film formed on said first electrode film and a second piezoelectric film that is formed on said first piezoelectric film and is controlled in crystal orientation thereof by said first piezoelectnc film; and
   a second electrode film formed on said second piezoelectric film,
   wherein each of said first piezoelectric film and said second piezoelectric film is an aggregate of columnar grains grown unidirectionally along a thickness direction of said piezoelectric layered film,
   a columnar grain of said second piezoelectric film has a larger cross-sectional diameter than a columnar grain of said first piezoelectric film, and
   a ratio l/d of a thickness l of said piezoelectric layered film to the cross-sectional diameter d of said columnar grain of said second piezoelectric film is not less than 20 and not more than 60.

2. A piezoelectric element comprising:
   a first electrode film;
   a buffer layer film formed on said first electrode film;
   a piezoelectric layered film composed of a first piezoelectric film formed on said buffer layer film and a second piezoelectric film that is formed on said first piezoelectric film and is controlled in crystal orientation thereof by said first piezoelectric film; and a second electrode film formed on said second piezoelectric film, wherein each of said first piezoelectric film and said second piezoelectric film is an aggregate of columnar grains grown unidirectionally along a thickness direction of said piezoelectric layered film, a columnar grain of said second piezoelectric film has a larger cross-sectional diameter than a columnar grain of said first piezoelectric film, and a ratio l/d of a thickness l of said piezoelectric layered film to the cross-sectional diameter d of said columnar grain of said second piezoelectric film is not less than 20 and not more than 60.

3. The piezoelectric element of claim 1, further comprising a diaphragm film formed on a face of said first electrode film opposite to said first piezoelectric film or on a face of said second electrode film opposite to said second piezoelectric film.

4. The piezoelectric element of claim 2, further comprising a diaphragm film formed on a face of said first electrode film opposite to said first piezoelectric film or on a face of said second electrode film opposite to said second piezoelectric film.

5. The piezoelectric element of claim 3,
wherein said diaphragm film is made of one of silicon, glass, a ceramic material and a metal material.

6. The piezoelectric element of claim 4,
wherein said diaphragm film is made of one of silicon, glass, a ceramic material and a metal material.

7. The piezoelectric element of claim 1,
wherein said columnar grain of said first piezoelectric film has a cross-sectional diameter not less than 40 nm and not more than 70 nm and a length not less than 5 nm and not more than 100 nm.

8. The piezoelectric element of claim 2,
wherein said columnar grain of said first piezoelectric film has a cross-sectional diameter not less than 40 nm and not more than 70 nm and a length not less than 5 nm and not more than 100 nm.

9. The piezoelectric element of claim 1,
wherein said columnar grain of said second piezoelectric film has a cross-sectional diameter not less than 60 nm and not more than 200 nm and a length not less than 2500 nm and not more than 5000 nm.

10. The piezoelectric element of claim 2,
wherein said columnar grain of said second piezoelectric film has a cross-sectional diameter not less than 60 nm and not more than 200 nm and a length not less than 2500 nm and not more than 5000 nm.

11. The piezoelectric element of claim 1,
wherein each of said first piezoelectric film and said second piezoelectric film is made of an oxide with a perovskite type crystal structure including at least Pb, Zr and Ti, and assuming that a (001) crystal orientation ratio of a piezoelectric film obtained on the basis of refraction intensities of respective crystal faces of a diffraction pattern obtained by X-ray diffraction method is defined as a percentage of a sum of a (001) peak intensity and a (002) peak intensity to a sum of all peak intensities derived from said piezoelectric film within an X-ray diffraction range of an interstitial distance of 4.2 Å to 1.5 Å, said first piezoelectric film has a (001) crystal orientation ratio not less than 50% and not more than 80% and said second piezoelectric film has a (001) crystal orientation ratio not less than 95% and not more than 100%.

12. The piezoelectric element of claim 2,
wherein each of said first piezoelectric film and said second piezoelectric film is made of an oxide with a perovskite type crystal structure including at least Pb, Zr and Ti, and assuming that a (001) crystal orientation ratio of a piezoelectric film obtained on the basis of refraction intensities of respective crystal faces of a diffraction pattern obtained by X-ray diffraction method is defined as a percentage of a sum of a (001) peak intensity and a (002) peak intensity to a sum of all peak intensities derived from said piezoelectric film within an X-ray diffraction range of an interstitial distance of 4.2 Å to 1.5 Å, said first piezoelectric film has a (001) crystal orientation ratio not less than 50% and not more than 80% and said second piezoelectric film has a (001) crystal orientation ratio not less than 95% and not more than 100%.

13. The piezoelectric element of claim 1,
wherein each of said first piezoelectric film and said second piezoelectric film includes at least Pb, Zr and Ti in a chemical composition ratio of Pb:Zr:Ti of (1+a):b:(1−b), said b has a value that is the same and is not less than 0.50 and not more than 0.60 in said first and second piezoelectric films, a Pb content in said first piezoelectric film is larger than a Pb content in said second piezoelectric film, and said a has a value that is not less than 0.05 and not more than 0.15 in said first piezoelectric film and a value that is not less than 0 and not more than 0.10 in said second piezoelectric film.

14. The piezoelectric element of claim 2,
wherein each of said first piezoelectric film and said second piezoelectric film includes at least Pb, Zr and Ti in a chemical composition ratio of Pb:Zr:Ti of (1+a):b:(1−b), and said b has a value that is the same and is not less than 0.50 and not more than 0.60 in said first and second piezoelectric films.

15. The piezoelectric element of claim 1,
wherein said first electrode film is made of a noble metal of Pt or Ir, or an alloy of said noble metal including at least one of Ti, Co and Ni, and is an aggregate of columnar grains each with a cross-sectional diameter not less than 20 nm and not more than 30 nm.

16. The piezoelectric element of claim 2,
wherein said first electrode film is made of a noble metal of Pt or Ir, or an alloy of said noble metal including at least one of Ti, Co and Ni, and is an aggregate of columnar grains each with a cross-sectional diameter not less than 20 nm and not more than 30 nm.

17. The piezoelectric element of claim 2,
wherein said buffer layer film is made of lead lanthanum titanate or lead lanthanum titanate including at least one of magnesium and manganese.

18. The piezoelectric element of claim 2,
wherein said buffer layer film is made of an oxide with a perovskite type crystal structure including strontium.

19. The piezoelectric element of claim 2,
wherein said buffer layer film includes strontium titanate.

20. An inkjet head comprising:
- a head body including a nozzle and a pressure chamber, for containing an ink, communicated with said nozzle; and
- a piezoelectric element, which is provided with a part of a face corresponding to one end thereof along a thickness direction facing said pressure chamber, for applying a pressure to said ink contained in said pressure chamber for discharging said ink from said nozzle,
- wherein said piezoelectric element includes a first electrode film, a piezoelectric layered film composed of a first piezoelectric film formed on said first electrode film and a second piezoelectric film formed on said first piezoelectric film and controlled in crystal orientation thereof by said first piezoelectric film, and a second electrode film formed on said second piezoelectric film,
- each of said first piezoelectric film and said second piezoelectric film is an aggregate of columnar grains grown unidirectionally along a thickness direction of said piezoelectric layered film,
- a columnar grain of said second piezoelectric film has a cross-sectional diameter larger than a columnar grain of said first piezoelectric film, and
- a ratio l/d of a thickness l of said piezoelectric layered film to the cross-sectional diameter d of said columnar grain of said second piezoelectric film is not less than 20 and not more than 60.

21. An inkjet head comprising:
- a head body including a nozzle and a pressure chamber, for containing an ink, communicated with said nozzle; and
- a piezoelectric element, which is provided with a part of a face corresponding to one end thereof along a thickness direction facing said pressure chamber, for applying a pressure to said ink contained in said pressure chamber for discharging said ink from said nozzle,
- wherein said piezoelectric element includes a first electrode film, a buffer layer film formed on said first electrode film, a piezoelectric layered film composed of a first piezoelectric film formed on said buffer layer film and a second piezoelectric film formed on said first piezoelectric film and controlled in crystal orientation thereof by said first piezoelectric film, and a second electrode film formed on said second piezoelectric film,
- each of said first piezoelectric film and said second piezoelectric film is an aggregate of columnar grains grown unidirectionally along a thickness direction of said piezoelectric layered film,
- a columnar grain of said second piezoelectric film has a cross-sectional diameter larger than a columnar grain of said first piezoelectric film, and
- a ratio l/d of a thickness l of said piezoelectric layered film to the cross-sectional diameter d of said columnar grain of said second piezoelectric film is not less than 20 and not more than 60.

22. An inkjet recording apparatus comprising:
- an inkjet head including a head body having a nozzle and a pressure chamber, for containing an ink, communicated with said nozzle, and a piezoelectric element, which is provided with a part of a face corresponding to one end thereof along a thickness direction facing said pressure chamber, for applying a pressure to said ink contained in said pressure chamber for discharging said ink from said nozzle; and
- moving means for moving said inkjet head relatively to a recording medium,
- wherein said piezoelectric element includes a first electrode film, a piezoelectric layered film composed of a first piezoelectric film formed on said first electrode film and a second piezoelectric film formed on said first piezoelectric film and controlled in crystal orientation thereof by said first piezoelectric film, and a second electrode film formed on said second piezoelectric film,
- each of said first piezoelectric film and said second piezoelectric film is an aggregate of columnar grains grown unidirectionally along a thickness direction of said piezoelectric layered film,
- a columnar grain of said second piezoelectric film has a cross-sectional diameter larger than a columnar grain of said first piezoelectric film, and
- a ratio l/d of a thickness l of said piezoelectric layered film to the cross-sectional diameter d of said columnar grain of said second piezoelectric film is not less than 20 and not more than 60.

23. An inkjet recording apparatus comprising:
- an inkjet head including a head body having a nozzle and a pressure chamber, for containing an ink, communicated with said nozzle, and a piezoelectric element, which is provided with a part of a face corresponding to one end thereof along a thickness direction facing said pressure chamber, for applying a pressure to said ink contained in said pressure chamber for discharging said ink from said nozzle; and
- moving means for moving said inkjet head relatively to a recording medium,
- wherein said piezoelectric element includes a first electrode film, a buffer layer film formed on said first electrode film, a piezoelectric layered film composed of a first piezoelectric film formed on said buffer layer film and a second piezoelectric film formed on said first piezoelectric film and controlled in crystal orientation thereof by said first piezoelectric film, and a second electrode film formed on said second piezoelectric film,
- each of said first piezoelectric film and said second piezoelectric film is an aggregate of columnar grains grown unidirectionally along a thickness direction of said piezoelectric layered film,
- a columnar grain of said second piezoelectric film has a cross-sectional diameter larger than a columnar grain of said first piezoelectric film, and
- a ratio l/d of a thickness l of said piezoelectric layered film to the cross-sectional diameter d of said columnar grain of said second piezoelectric film is not less than 20 and not more than 60.

24. An angular velocity sensor comprising:
- a substrate composed of a fixed part and at least a pair of vibrating parts extending from said fixed part toward a given direction; and
- a piezoelectric element provided on at least each of said vibrating parts on said substrate,
- wherein said piezoelectric element includes a first electrode film, a piezoelectric layered film composed of a first piezoelectric film formed on said first electrode film and a second piezoelectric film formed on said first piezoelectric film and controlled in crystal orientation thereof by said first piezoelectric film, and a second electrode film formed on said second piezoelectric film,
- each of said first piezoelectric film and said second piezoelectric film is an aggregate of columnar grains grown unidirectionally along a thickness direction of said piezoelectric layered film, a columnar grain of said second piezoelectric film has a cross-sectional diameter larger than a columnar grain of said first piezoelectric film, a ratio l/d of a thickness l of said piezoelectric layered film to the cross-sectional diameter d of said columnar grain of said second piezoelectric film is not less than 20 and not more than 60, and said second electrode film is formed in patterns of at least one driving electrode for vibrating said vibrating parts along a width direction of said vibrating parts and at least one detecting electrode for detecting deformation along the thickness direction of said vibrating parts.

25. An angular velocity sensor comprising:

a substrate composed of a fixed part and at least a pair of vibrating parts extending from said fixed part toward a given direction; and a piezoelectric element provided on at least each of said vibrating parts on said substrate, wherein said piezoelectric element includes a first electrode film, a buffer layer film formed on said first electrode film, a piezoelectric layered film composed of a first piezoelectric film formed on said buffer layer film and a second piezoelectric film formed on said first piezoelectric film and controlled in crystal orientation thereof by said first piezoelectric film, and a second electrode film formed on said second piezoelectric film, each of said first piezoelectric film and said second piezoelectric film is an aggregate of columnar grains grown unidirectionally along a thickness direction of said piezoelectric layered film, a columnar grain of said second piezoelectric film has a cross-sectional diameter larger than a columnar grain of said first piezoelectric film, a ratio l/d of a thickness l of said piezoelectric layered film to the cross-sectional diameter d of said columnar grain of said second piezoelectric film is not less than 20 and not more than 60, and said second electrode film is formed in patterns of at least one driving electrode for vibrating said vibrating parts along a width direction of said vibrating parts and at least one detecting electrode for detecting deformation along the thickness direction of said vibrating parts.

26. The angular velocity sensor of claim 24,
wherein said substrate is made of silicon or glass.

27. The angular velocity sensor of claim 25,
wherein said substrate is made of silicon or glass.

* * * * *

UNITED STATES PATENT AND TRADEMARK OFFICE
CERTIFICATE OF CORRECTION

| | | |
|---|---|---|
| PATENT NO. | : 7,145,285 B2 | Page 1 of 1 |
| APPLICATION NO. | : 10/894474 | |
| DATED | : December 5, 2006 | |
| INVENTOR(S) | : Hideo Torii et al. | |

It is certified that error appears in the above-identified patent and that said Letters Patent is hereby corrected as shown below:

COL. 42

Line 48, Claim 1, "piezoelectnc" should be -- piezoelectric --

Signed and Sealed this

First Day of May, 2007

JON W. DUDAS
*Director of the United States Patent and Trademark Office*